(12) United States Patent
Liang et al.

(10) Patent No.: US 12,210,282 B2
(45) Date of Patent: Jan. 28, 2025

(54) PRIMERS WITH IMPROVED REFLECTIVE AND THERMALLY INSULATIVE PROPERTIES FOR MICROCAPSULE IMAGING SYSTEM

(71) Applicant: Polaroid IP B.V., Enschede (NL)

(72) Inventors: Rong-Chang Liang, Cupertino, CA (US); Wei You, Taichung (TW); Yi Wen Chen, Ji'an Township, Hualien County (TW)

(73) Assignee: Polaroid IP B.V., Enschede (NL)

( * ) Notice: Subject to any disclaimer, the term of this patent is extended or adjusted under 35 U.S.C. 154(b) by 158 days.

(21) Appl. No.: 17/833,735

(22) Filed: Jun. 6, 2022

(65) Prior Publication Data
US 2023/0393460 A1 Dec. 7, 2023

(51) Int. Cl.
*G03F 7/11* (2006.01)
*B41M 5/136* (2006.01)
(Continued)

(52) U.S. Cl.
CPC ............ *G03F 7/002* (2013.01); *B41M 5/136* (2013.01); *B41M 5/155* (2013.01); *B41M 5/165* (2013.01); *G03F 7/092* (2013.01); *G03F 7/11* (2013.01); *B41M 5/287* (2013.01); *B41M 2205/36* (2013.01); *B41M 2205/38* (2013.01)

(58) Field of Classification Search
CPC ............ G03F 7/002; G03F 7/092; G03F 7/11; B41M 5/136; B41M 5/155; B41M 5/165; B41M 2205/36; B41M 2205/38
See application file for complete search history.

(56) References Cited

U.S. PATENT DOCUMENTS

| 4,399,209 A | 8/1983 | Sanders et al. |
| 4,416,966 A | 11/1983 | Sanders et al. |

(Continued)

FOREIGN PATENT DOCUMENTS

| EP | 0980026 A1 * | 2/2000 |
| EP | 3 838 610 A1 | 6/2021 |

(Continued)

OTHER PUBLICATIONS

International Search Report and Written Opinion for International Application No. PCT/IB2023/055711, dated Sep. 25, 2023, 17 pgs.
(Continued)

*Primary Examiner* — Gerard Higgins
(74) *Attorney, Agent, or Firm* — Foley & Lardner LLP

(57) ABSTRACT

Primer layers having improved reflectivity and thermal insulation properties are provided for use in microencapsulated thermal imaging sheets. Primer layers having a polymeric binder, of about 3% to about 60% by weight, relative to the total weight of the primer layer, of a white particulate, a primer substrate, and hollow particulate particles improve the reflectivity, color development, color density, and thermal insulation of microcapsule imaging sheets including the same. A black back-coat applied to the substrate on a side opposite the primer layer further enhances the Dmax and $E_{10}$ of microcapsule imaging sheets and prevents premature exposure of microcapsule imaging sheets in stacked media.

18 Claims, 15 Drawing Sheets

(51) Int. Cl.
*B41M 5/155* (2006.01)
*B41M 5/165* (2006.01)
*G03F 7/00* (2006.01)
*G03F 7/09* (2006.01)
*B41M 5/28* (2006.01)

(56) References Cited

U.S. PATENT DOCUMENTS

| | | | |
|---|---|---|---|
| 4,440,846 A | 4/1984 | Sanders et al. | |
| 4,532,200 A | 7/1985 | Arney et al. | |
| 4,536,463 A | 8/1985 | Sanders | |
| 4,766,050 A | 8/1988 | Jerry | |
| 4,772,541 A | 9/1988 | Gottschalk et al. | |
| 4,889,786 A | 12/1989 | Takahashi | |
| 4,895,880 A | 1/1990 | Gottschalk et al. | |
| 4,925,827 A * | 5/1990 | Goto | B41M 5/42 |
| | | | 427/152 |
| 4,962,010 A | 10/1990 | Colyer et al. | |
| 5,030,543 A * | 7/1991 | Watanabe | G03F 7/0285 |
| | | | 430/510 |
| 5,053,309 A | 10/1991 | Sanders et al. | |
| 5,100,755 A | 3/1992 | Shanklin | |
| 5,120,475 A | 6/1992 | Chen et al. | |
| 5,292,610 A | 3/1994 | Helling et al. | |
| 5,525,686 A | 6/1996 | Tanabe et al. | |
| 5,620,827 A | 4/1997 | Cheng et al. | |
| 5,783,353 A | 7/1998 | Camillus et al. | |
| 6,030,740 A * | 2/2000 | Polykarpov | G03F 7/002 |
| | | | 430/281.1 |
| RE37,257 E | 7/2001 | Sanders | |
| 6,326,120 B1 | 12/2001 | Wang et al. | |
| 6,365,319 B1 | 4/2002 | Heath et al. | |
| 6,468,708 B1 | 10/2002 | Wang et al. | |
| 6,576,399 B1 | 6/2003 | Gries et al. | |
| 6,740,465 B2 | 5/2004 | Liang et al. | |
| 7,153,628 B2 | 12/2006 | Liu et al. | |
| 8,334,047 B2 * | 12/2012 | Kelly | D21H 21/54 |
| | | | 428/407 |
| 2005/0084790 A1 | 4/2005 | Schroeder et al. | |
| 2005/0263022 A1 | 12/2005 | Cassidy | |

FOREIGN PATENT DOCUMENTS

| | | |
|---|---|---|
| JP | S60-105584 A | 6/1985 |
| JP | H0752569 A * | 2/1995 |
| JP | H07-306505 A | 11/1995 |
| JP | H09-244228 A | 9/1997 |
| JP | 2010082930 A * | 4/2010 |

OTHER PUBLICATIONS

Arney et al., Grey Scale Characteristics of the Microencapsulated Acrylate Process of Imaging, SPIE vol. 1253 Hard Copy and Printing Materials, Media, And Process, pp. 252-263 (Jul. 1990) (12 pages).

Camillus et al., Exposing Cycolor Film using Telegen's New Linear Head, Cycolor Incorporated; IS&T's NIP18: 2002 Int'l. Conf. on Digital Printing Technologies (4 pages), pp. 441-444.

Cycolor Definition, PC Magazine © 2019 (accessed Apr. 2019) (3 pages).

Gregory, "High-Technology Applications of Organic Colorants", Ch. 8, Plenum Press (1991) (53 pages).

Muthyala, ed., "Chemistry and Applications of Leuco Dyes", Ch. 4, Plenum Press (1997) (29 pages).

Rastogi et al., Cycolor® Imaging Technology, SPIE Proc., vol. 1079, Hard Copy Output, pp. 183-214 (1989) (32 pages).

Office Action in U.S. Appl. No. 17/833,731 dtd Aug. 27, 2024.

Vitale et al., "Visible Light Curable Restorative Composites for Dental Applications Based on Epoxy Monomer," Materials, Jan. 2014, 7, 554-562, doi: 10.3390/ma7010554.

* cited by examiner

PRIMERS WITH IMPROVED REFLECTIVE AND THERMALLY INSULATIVE PROPERTIES FOR MICROCAPSULE IMAGING SYSTEM

FIELD

The present disclosure relates generally to the field of microcapsule imaging systems and more particularly to primers for use in the same.

BACKGROUND

Single-sheet, self-containing, full-color microcapsule imaging systems (e.g., Cycolor) have been developed since the 1980s. In these imaging systems, an imaging sheet including a layer of microcapsules comprising a photo-hardenable or photo-softenable composition and a leuco dye in the internal phase is image-wise exposed to actinic radiation. Typically, the photosensitive composition comprises a photopolymerizable, multifunctional acrylate, a photoinitiator, and a color former. Generally, the microcapsules are image-wise hardened by actinic radiation, and upon passing the exposed imaging sheet through a pressure roller, the microcapsules may be image-wise ruptured to release the internal phase encapsulated therein. The leuco dyes thus released migrate to a developer material and react to form a continuous-tone, full-color image with its color density (or grayscale) modulated by the exposure energy (time or pulse width), intensity (pulse amplitude), and/or pulse frequency. Such self-contained, single-sheet imaging systems are utilizable for lightweight, portable, high-speed printing applications.

SUMMARY

Typical microcapsule imaging systems suffer from several drawbacks. For instance, very high pressure is required to rupture the microcapsules, causing inefficient dye release, poor color density (Dmax), and a slow rate of color development. Although these issues may be partially resolved by using larger microcapsules, image resolution and ease of handling deteriorate dramatically as the microcapsule size increases.

Additionally, a white substrate is often used to improve the color density of the image areas (and to improve the whiteness of the non-imaging areas). However, the reflectivity of most commercially available white substrates, particularly thin (≤50 μm) substrates, is unsatisfactory. Significant light losses (e.g., leaking) through the substrate causes undesirably low color density and saturation. For example, the reflectivity (%) of a commercially available white PET (e.g., MELINEX® 339 (made by Dupont Teijin Films LP of Chester, VA), 50 μm) is only about 85%. That is, approximately 15% of the incoming light or color leaks through the substrate and is not reflected back to the viewer's eyes. Relatedly, substrates with low reflectivity tend to have low hiding power. When an image sheet of a low hiding power is placed on the top of a highly colored background, the images in the viewer's eyes appear "contaminated" by the background colors or patterns. An image sheet of high reflectivity and hiding power is particularly beneficial to the image quality when a black annihilation layer on the opposite side of the substrate (against the microcapsule imaging layer) is used to improve the resolution and ensure no light leakage that would prematurely expose the immediately underlying second imaging sheet in a media stack.

Further, to alleviate the slow color development discussed above, some technologies require a heating step to increase the rate of color development after the microcapsules are crushed under pressure. The heating step requires significant expenditure of energy (or battery power), which is exacerbated by wasted heat dissipating through the substrate, particularly when a thick sticker and release liner are attached to the back of the image sheet.

Moreover, to improve adhesion of the microcapsules to the substrate, some technologies use a primer coating between the substrate and the microcapsule layer. However, the primer coating is often soft or tacky and sticks to the facing rollers of the coater or to the back of the substrate during rewinding. This results in a poor coating quality and low yield rate. A release coating on the back of the substrate or an interleaf may be used to prevent these problems, but these solutions imply extra processing steps, materials, and costs. Moreover, the release coating on the back of the substrate may cause de-adhesion of the sticker, if present, from the image sheet.

Against this backdrop, there exists great commercial interest in primer layers addressing some or all the aforementioned issues. Primer layers according to the present disclosure afford significant improvements in Dmax, rate of color development (fresh Dmax), Dmin stability, energy consumption, printing speed, hiding power, blistering and blocking resistances, ease of handling, ease of processing, cost, and yield rate of the primer coating, without requiring tradeoffs in the quality of adhesion between the image sheet and the sticker.

In one aspect, which may be combined with any other aspect or embodiment the present disclosure relates to a primer layer for a microcapsule imaging sheet, comprising: a polymeric binder; one or more particulates (e.g., white particulates) making up about 3% to about 60% by weight of a total weight of the primer layer; and a substrate. In some embodiments, the primer layer further comprises a polymeric hollow particle of about 1% to about 30% by weight of the total weight of the primer layer.

In some embodiments, the white particulate has a refractive index of from about 1.5 to about 3.0. In some embodiments, the particulate is selected from the group consisting of: $TiO_2$, $BaSO_4$, $CaSO_4$, $CaCO_3$, BN, $Al_2O_3$, $Ca_3(PO_4)_2$. In some embodiments, the white particulate is $TiO_2$. In some embodiments, the white particulate has an average particle size of about 50 nm to about 2000 nm. In some embodiments, the white particulate has an average particle size of about 100 nm to about 300 nm. In some embodiments, the concentration of the white particulate is about 10% to about 50% by weight, relative to the total weight of the primer layer. In some embodiments, the white particulate comprises $TiO_2$ and a basic particulate. In some embodiments, the basic particulate is selected from $CaCO_3$, $Al_2O_3$, or $Ca_3(PO_4)_2$.

In some embodiments, the polymeric binder comprises a latex polymer having a glass transition temperature (Tg) of about −70° C. to about 40° C. In some embodiments, the polymeric binder comprises a latex polymer having a Tg of about −20° C. to about 20° C. In some embodiments, the polymeric binder is selected from the group consisting of acrylic polymers or copolymers, styrene copolymers, butadiene copolymers, vinyl chloride copolymers, vinylidene chloride copolymers, epoxy copolymers, ethylene copolymers, propylene copolymers, vinyl acetate copolymers, polyesters, polyurethanes, polylactones, polyamides, polyvinyl pyrrolidone, and blends or copolymers thereof.

In some embodiments, the polymeric hollow particle comprises a polymeric shell and an air core. In some embodiments, the polymeric hollow particle comprises a polymeric shell comprising a polymer selected from the group consisting of polyacrylate, polymethacrylate, polystyrene, polyvinyl acetate, polyolefin, polyamide, polyester, polyurea, polyurethane, melamine formaldehyde, phenolic resins, and blends or copolymers thereof. In some embodiments, the polymeric shell of the hollow particle is cross-linked or filled with an inorganic filler such as silica.

In some embodiments, the polymeric hollow particle has an average particle diameter of from about 200 nm to about 2000 nm or about 500 nm to about 2000 nm. In some embodiments, the polymeric hollow particle has an average particle diameter of from about 100 nm to about 1000 nm, or about 300 nm to about 1000 nm. In some embodiments, the air core has an average diameter of from about 50 nm to about 1000 nm. In some embodiments, the air core has an average diameter of from about 100 nm to about 400 nm. In some embodiments, the polymeric hollow particle has a dry specific gravity of about 0.1 $g/cm^3$ to about 0.7 $g/cm^3$. In some embodiments, the polymeric hollow particle is present at concentration of about 5% to about 30% by weight, relative to the total weight of the primer layer.

In some embodiments, the polymeric hollow particles comprise a blend of a first polymeric hollow particle having a first average particle diameter and a second polymeric hollow particle having a second average particle diameter.

In some embodiments, the primer layer has a thickness of about 1 μm to 10 μm. In some embodiments, the primer layer has a thickness of about 2 μm to about 5 μm.

In another aspect, which may be combined with any other aspect or embodiment, the present disclosure relates to a microcapsule imaging sheet, comprising: the primer layer according to any of the above-discussed embodiments; and a photosensitive microcapsule layer in contact with the primer layer. In some embodiments, the microcapsule imaging sheet, comprises: a first substrate; the primer layer according to any of the above-discussed embodiments in contact with a first surface of the first substrate; and a photosensitive microcapsule layer comprising photosensitive microcapsules in contact with the first substrate, the primer layer, or both the primer layer and the first substrate.

In another aspect, which may be combined with any other aspect or embodiment, the present disclosure relates to a microcapsule imaging sheet comprising a primer layer on a first surface of the substrate and a back-coat on a second surface of the substrate to improve the image resolution and energy efficiency. In some embodiments, the microcapsule layer is coated on the primer layer. In some embodiments, the back-coat comprises essentially the same hollow particles and reflective particulates as those in the primer layer. In some embodiments, the back-coat is deposited on the second surface of the substrate by vapor deposition, sputtering, spraying, or wet coating. In some embodiments, the backcoat is blackened by a black dye or pigment such as carbon black to further improve the resolution and eliminate the risk of light leaking through the imaging sheet and cause a premature exposure of the underlying imaging sheet in a stack.

In some embodiments, the microcapsule imaging sheet is a full-color imaging sheet comprising photosensitive microcapsules including red-sensitive, green-sensitive, and blue-sensitive microcapsules.

In some embodiments, the photosensitive microcapsules comprise a polymeric shell and a core comprising a leuco dye, a photoinitiator, and a polymerizable or crosslinkable monomer or oligomer. In some embodiments, the leuco dye is one or more of a cyan, magenta, yellow, or black leuco dye. In some embodiments, the photoinitiator is a red-sensitive, green-sensitive, or blue-sensitive photoinitiators or sensitizers such as cyanine borate or semi-cyanine borate. In some embodiments, the photoinitiator comprises, consists essentially of, or consists of a UV-sensitive or near-IR-sensitive photoinitiator or sensitizer such as ketocoumarin, isopropylthioxanthone (ITX) and squarylium dyes.

In some embodiments, the microcapsule imaging sheet further comprises a developer layer in contact with: (i) the microcapsule layer and/or the primer layer and (ii) a developer substrate. In some embodiments, the microcapsules are blended with developer compositions and coated as a single layer on the primer layer.

In some embodiments, the back-coat comprises a black pigment or dye and a polymeric binder. In some embodiments, the back-coat comprises 1-30 wt. % of the black pigment or dye, relative to the total weight of the back-coat. In some embodiments, the back-coat comprises 3-wt. % of the black pigment or dye, relative to the total weight of the back-coat. In some embodiments, the black pigment is carbon black.

In some embodiments, the back-coat further comprises a hollow polymeric particle. In some embodiments, the back-coat further comprises one or more particulates (e.g., white particulates) selected from the group consisting of: $TiO_2$, $BaSO_4$, $CaSO_4$, BN, $CaCO_3$, $Al_2O_3$, $Ca_3(PO_4)_2$.

In another aspect, which may be combined with any other aspect or embodiment, the present disclosure relates to a method of preparing an imaging sheet, the method comprising: (i) coating a first surface of a first substrate with a primer layer according any of the embodiments disclosed herein, to produce a primer-coated first substrate; (ii) contacting the primer layer of the primer-coated first substrate with a microcapsule layer to produce a microcapsule-coated first substrate; (iii) contacting the microcapsule-coated first substrate with a developer layer to produce a developer-coated first substrate; and (iv) contacting the developer layer of the developer-coated first substrate with a second substrate to produce an imaging sheet.

In another aspect, which may be combined with any other aspect or embodiment, the present disclosure relates to a method of preparing an imaging sheet, the method comprising: (i) coating a first surface of a first substrate with a primer layer according to any embodiment disclosed herein, to produce a primer-coated first substrate; (ii) contacting the primer layer of the primer-coated first substrate with a microcapsule layer to produce a microcapsule-coated first substrate; (iii) contacting a second substrate with a developer layer to produce a developer-coated second substrate; and (iv) contacting the developer layer of the developer-coated second substrate with the microcapsule layer of the microcapsule-coated first substrate to produce an imaging sheet.

In some embodiments, a second primer layer is positioned between the second substrate and the developer layer.

In some embodiments, the method further comprises (v) contacting a second surface of the first substrate with a back-coat, wherein the second surface of the first substrate is opposite the first surface of the first substrate. In some embodiments, the contacting in (v) is performed by physical vapor deposition, sputtering, chemical vapor deposition, lamination, or spin-coating.

In another aspect, which may be combined with any other aspect or embodiment, the present disclosure relates to a method of imaging or printing, the method comprising exposing an imaging sheet comprising a primer layer according to any embodiment disclosed herein and a microcapsule layer comprising microcapsules, to heat, pressure, or radiation; wherein the microcapsules comprise a polymeric shell and an internal phase comprising a leuco dye, to heat, pressure, or radiation; and wherein the exposing is sufficient to release leuco dye from the microcapsules in the microcapsule layer to produce an image.

Additional aspects and/or embodiments of the invention will be provided, without limitation, in the detailed description of the present technology set forth below. The following detailed description is exemplary and explanatory, but it is not intended to be limiting.

BRIEF DESCRIPTION OF THE DRAWINGS

Various objects, aspects, features, and advantages of the disclosure will become more apparent and better understood by referring to the detailed description taken in conjunction with the accompanying figures.

DETAILED DESCRIPTION

In the following description, numerous specific details are set forth in order to provide a thorough understanding of the present technology. Particular exemplary embodiments of the present technology may be implemented without some or all of these specific details. In other instances, certain process operations have not been described in detail but would be understood by the skilled person in the art.

Photosensitive Microcapsule Layer

Figures 1A, 1B:
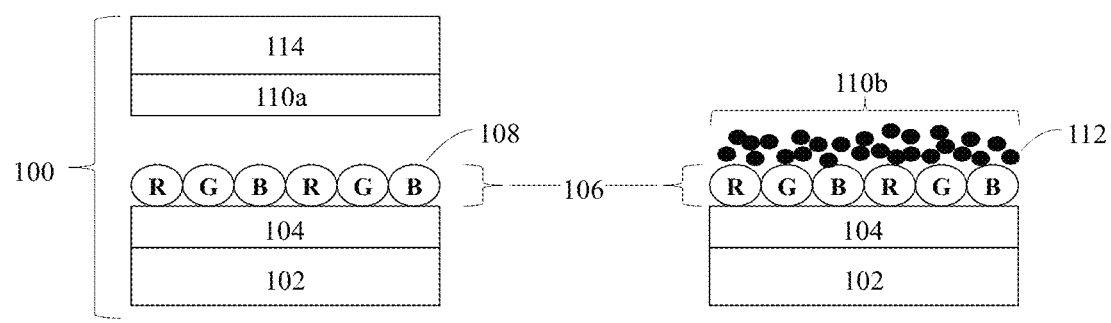
FIG. 1A is a schematic illustration of one embodiment of a microcapsule imaging sheet with a primer coating between the microcapsule layer and the substrate according to the present disclosure.
FIG. 1B is a schematic illustration of another microcapsule imaging sheet with a primer coating between the microcapsule layer and the substrate according to the present disclosure.

Referring to FIG. 1A and FIG. 1B, in some embodiments, a microcapsule imaging sheet 100 according to the present disclosure includes a photosensitive microcapsule layer 106. Photosensitive microcapsules 108 can comprise a polymeric shell and a core within the polymeric shell, the core comprising a photosensitizer or photoinitiator, a photohardenable monomer or oligomer, and a dye precursor (e.g., a leuco dye), which imparts color to the microcapsule imaging sheet upon release under pressure and subsequent exposure to heat, certain pH conditions, reactive chemical species (e.g., Lewis acids), or a developer. The shell may function as an oxygen barrier to assure a high photosensitivity of the photosensitive core and to avoid any premature intermixing of photoinitiators and dye precursors of various colors, thereby ensuring successful color separation and reproduction. In some embodiments, the photohardenable monomer may be replaced with a photosoftenable or photodegradable composition.

The developer, for example, may be present in a developing layer 110a in contact with a developer substrate 114, which is configured to be separately placed into contact with the microcapsule layer 106, or present as a developer particle layer 110b in discrete developer particles 112. In some embodiments, the developer may be mixed with the microcapsules and coated as a single layer (not shown). Upon release from the microcapsule 108, the dye precursor (e.g., a leuco dye) undergoes a chemical transformation, transitioning from a colorless state to a color state (e.g., magenta, cyan, yellow, or black). Useful developers include, but are not limited to, acid clay, salicylic acid derivatives, phenolic and novolac resins particularly those grafted or copolymerized with salicylic acid derivatives, and their zinc complexes.

The photosensitive microcapsule layer may comprise one or more types of microcapsules. For instance, a positively-working full color microcapsule imaging sheet may comprise three types microcapsules: a red-sensitive microcapsule comprising a red-sensitive photoinitiator and a cyan leuco dye, a green-sensitive microcapsule comprising a green-sensitive photoinitiator and a magenta leuco dye, and a blue-sensitive microcapsule comprising a blue-sensitive photoinitiator and a yellow leuco dye. For example, in the positively-working imaging sheet, upon exposure to a white light, all three types of microcapsules are hardened, and no color will be formed after the color development step. Upon full exposure to red light, the red-sensitive microcapsules are hardened, so the cyan leuco dye will not be released in the development step. As a result, a red color will be reproduced in the exposed area. In contrast, upon full exposure to a combination of blue and green lights (a cyan color light), the corresponding magenta and yellow leuco dyes are not be released, and a cyan color is reproduced in the exposed area. Mid-tone colors of various color densities may also be reproduced in areas exposed to various lights of various energies and/or intensities.

In some embodiments, the dye precursor is a cyan, magenta, yellow, or black leuco dye. By way of non-limiting example, a representative leuco dye may include, but is not limited to, PERGASCRIPT® Red I6B, Blue I-2G or Blue-63 from BASF, Blue 220, Blue 203, Red 500, Red 40, or Black 305 from Yamada, JYDY-1, JYDR-2, JYDR-3, JYDB-1 or JYDB-2 from WuXi Jiayida New Materials, Red-16, O-C6, or O-C8 from Synmedia Chemicals, or ODB-2 from Anyang General Chemicals.

In some embodiments, the photoinitiator is a blue-, green- or red-sensitive cyanine borate, semi-cyanine borate, or ketocoumarins. Red, green, and blue photoinitiators with a narrow spectrum sensitivity bandwidth of less than 100 nm are preferred for a panchromatic imaging system. In some embodiments, the photoinitiator comprises, consists essentially of, or consists of a UV-sensitive or near-IR-sensitive photoinitiator or sensitizer such as ketocoumarin, isopropylthioxanthone (ITX) and squarylium dyes. In some embodiments, UV initiators or infrared initiators are used for false color imaging systems. In some embodiments, photosensitive microcapsules 108 may comprise a polymeric shell that is softenable by actinic irradiation, and a core comprising a dye precursor (e.g., a leuco dye). In this scenario, the core may also be photosoftenable or degradable. In this case, a negatively working image is obtained, in which the exposed area/capsule is colored after being developed with a developer. In some embodiments, the microcapsules further comprise a monomer or oligomer (e.g., a polymerizable or crosslinkable monomer or oligomer) selected from multifunctional acrylates and methacrylates, multifunctional vinyl ethers, multifunctional allyls or vinylbenzenes, and their oligomers, dendrimers or blends. Multifunctional acrylates are particularly useful for their superior photospeed, compatibility with leuco dyes and developers, and outdoor weatherability. Examples of the multifunctional acrylates include, but are not limited to pentaerythritol triacrylate (PETA-3), pentaerythritol tetra-acrylate (PETA-4), dipentaerythritol hexaacrylate (DPHA), dipentaerythritol pentaacrylate (DPPA), trimethylolpropane triacrylate (TMPTA), 1,6-hexanediol diacrylate (HDDA), tripropylene glycol diacrylate (TPGDA), and neopentyl glycol diacrylate (NPGDA).

Substrate

Primer layers 104 according to the present disclosure were coated on a substrate 102. The substrate may be any suitable material with sufficient thickness, flexibility, reflectivity (e.g., hiding power), and durability to record printed media (e.g., images). In some embodiments, the substrate is white or transparent. By way of non-limiting example, in some embodiments, the substrate is a polyethylene terephthalate (PET), polyethylene naphthalate (PEN), polycarbonate, polyolefins, cyclic olefin copolymers (COC), cellulose acetates, or a copolymer, blend or composite thereof. A series of PET substrate are readily commercially available (e.g., white PET films MELINEX® 329, 339, 394, 331, 534, and clear PET films MYLAR® from DuPont Teijin Films LP of Chester, VA, and HOSTAPHAN® from Mitsubishi).

The substrate may have any suitable thickness. In some embodiments, the substrate has a thickness from about 3.5 µm to about 150 µm, from about 12.5 µm to about 100 µm, or from about 25 µm to about 75 µm. In some embodiments, the substrate may be surface treated by, e.g., corona, plasma, or a sub-layer to improve the adhesion between the substrate and the primer or the back-coat. In some embodiments, one side of the substrate may be pretreated with an antistatic layer to reduce the undesirable static charge build-up during coating or printing. In some embodiments, one side of the substrate may be pre-treated with a release layer such as a polysiloxane or wax layer to improve the media transportation during printing and/or to improve the media blocking resistance during converting and packaging.

Primer Layer

In various implementations, microcapsule imaging sheets according to the present disclosure include a primer layer 104. The primer layer is disposed between the substrate and the microcapsule layer to improve the performance characteristics, including adhesion, image resolution, capsule rupture efficiency, or the fresh Dmax (maximum optical density) achievable immediately after pressure development, energy efficiency, and photospeed. In some embodiments, the thickness of the primer layer is from about 0.5 µm to about 10 µm, from about 1 µm to about 8 µm, or from about 2 µm to about 5 µm. In some embodiments, the primer layer may comprise a polymeric binder, a white particulate, and a substrate. In some embodiments, the primer layer may further comprise polymeric hollow particles. In some embodiments, the primer layer may further comprise a basic particulate.

Polymeric Binder

A primer layer according to the present disclosure comprises one or more polymeric binders. The one or more polymeric binders may be any suitable polymeric material, present at any suitable concentration, and having any suitable molecular weight, for imparting favorable adhesion, flexibility, blocking resistance, and film quality (e.g., uniform thickness) to the primer layer.

In some embodiments, the one or more polymeric binders may comprise, consist essentially of, or consist of one or more polymers selected from the group consisting of acrylic polymers or copolymers, styrene copolymers, butadiene copolymers, vinyl chloride copolymers, vinylidene chloride copolymers, ethylene copolymers, propylene copolymers, vinyl acetate copolymers, epoxy copolymers, polyesters, polyurethanes, polylactones, polyamides, polyolefins, polyvinylpyrrolidones, and blends or copolymers thereof. In some embodiments, the one or more polymeric binders is a latex polymer, or a blend thereof.

In some embodiments, the one or more polymeric binders may have a weight average molecular weight of about 5,000 g/mol to about 10,000,000 g/mol. In some embodiments, the one or more polymeric binders comprises, consists essentially of, or consists of latex binders with a molecular weight in the range of 100,000 g/mol to several million g/mol and a particle size in the range of about 0.05 µm to about 1.0 µm. In some embodiments, useful latexes may have a minimum film formation temperature (MFFT) or glass transition temperature (Tg) lower than 50° C., lower than 30° C., or lower than 20° C. In some embodiments, a crosslinkable latex may be used to improve the cohesion strength of the primer layer.

In some embodiments, the one or more polymeric binders may have a weight average molecular weight of greater than or equal to about 5,000 g/mol, greater than or equal to about g/mol, greater than or equal to about 5,000,000 g/mol, greater than or equal to about g/mol, less than or equal to about 5,000,000 g/mol, less than or equal to about In some embodiments, the one or more polymeric binders, alone or in combination, may be present in the primer layer at a concentration, expressed in wt. % relative to the weight of the total primer layer, from about 5 wt. % to about 80 wt. %, preferably from about 10 wt % to about wt. %, more preferably from about 20 wt. % to about 60 wt. %, even more preferably from about 30 wt. % to about 50 wt. %.

In some embodiments, the one or more polymeric binders, alone or in combination, may be present in the primer layer at a concentration, expressed in wt. % relative to the weight of the total primer layer, of greater than or equal to about 5 wt. %, greater than or equal to about 10 wt. %, greater than or equal to about 80° C., greater than or equal to about 90° C., or greater than or equal to about 100° C., less than or equal to about 90° C., or less than or equal to about 80° C. In some embodiments, the one or more polymeric binders may have a glass transition temperature (Tg) of less than or equal to about −100° C. to about 100° C., from about −70° C. to about 60° C., or from about −30° C. to about 30° C. In some embodiments in which latex binders are used, the latex may have a minimum film formation temperature (MFFT) below 60° C., e.g., below 20° C. to ensure an acceptable film property after coating.

Particulates

In some embodiments, polymeric binder layers according to the present disclosure include one or more particulates, e.g., white particulates, such as white particulates with a high refractive index or reflectivity. The white particulates may be any suitable composition, size, and concentration for enhancing the reflectivity and/or hiding power of a primer layer.

In some embodiments, the one or more particulates may include one or more of $TiO_2$, $BaSO_4$, $CaSO_4$, $CaCO_3$, silica, BN, $Al_2O_3$, $Ca_3(PO_4)_2$, $Ca(HPO_4)$, $ZrO_2$, ZnO, or any other suitable metal oxide, transition metal oxide, sulfate, carbonate, or phosphate material. In some embodiments, the white particulate is one or more selected from the group consisting of: $TiO_2$, $BaSO_4$, $CaSO_4$, BN, $Al_2O_3$, $CaCO_3$, and $Ca_3(PO_4)_2$. In some embodiments, the white particulate comprises, consists essentially of, or consists of $TiO_2$.

In some embodiments, the one or more particulates may have an average particle diameter between about 0.1 µm to about 5 µm, between about 0.14 µm to about 2 µm, or between about 0.2 µm to about 1 µm.

In some embodiments, the one or more particulates may have an average particle size of greater than or equal to about 0.1 µm, greater than or equal to about 0.11 µm, greater than or equal to about 0.12 µm, greater than or equal to about 0.13 µm, greater than or equal to about 0.14 µm, greater than or equal to about 0.15 µm, greater than or equal to about 0.2 µm, greater than or equal to about 0.3 µm, greater than or equal to about 0.4 µm, greater than or equal to about 0.5 µm, greater than or equal to about 0.6 µm, greater than or equal to about 0.7 µm, greater than or equal to about 0.8 µm, greater than or equal to about 0.9 µm, greater than or equal to about 1 µm.

In some embodiments, the one or more particulates may comprise, consist essentially of, or consist of a single white particulate composition (e.g., $TiO_2$), or two or more white particulate compositions (e.g., $TiO_2$ and $Al_2O_3$).

In some embodiments, the one or more particulates may further comprise one or more basic particulates including, but not limited to, $Al_2O_3$, $CaCO_3$, or $Ca_3(PO_4)_2$. In some embodiments, the one or more basic particulates are included as a buffer in the primer layer to improve the Dmin stability by neutralizing or absorbing any acidic chemicals that may diffuse or migrate from other layers (e.g., the developer layer). In some embodiments, the one or more basic particulates is selected from the group consisting of $CaCO_3$, $Al_2O_3$, $Ca_3(PO_4)_2$.

In some embodiments, the one or more particulates may have only one average diameter (e.g., a mono-modal size distribution). In some embodiments, the one or more particulates may have a bi-modal or tri-modal size distribution (e.g., one white particulate with an average diameter of about 0.1 µm to about 2 µm and one white particulate with an average diameter of about 0.2 µm to about 0.5 µm, although other differences in average diameter may be realized, for example, in accordance with the differences between any two of the above-identified example average diameters).

In some embodiments, one or more filler particulates of a smaller particle size, such as silica or $CaCO_3$, may be used to further improve the packing density of the primer layer. Useful particle size ranges of the filler particulates may be from about 0.01 µm to about 1 µm, from about 0.02 µm to about 0.5 µm, from about 0.05 µm to 0.2 µm.

In some embodiments, the one or more particulates, alone or in combination, may be present in the primer layer at a concentration, expressed in wt. % relative to the weight of the total primer layer, from about 10 wt. % to about 50 wt. %, from about 15 wt. % to about 40 wt. %, or from about 20 wt. % to about 35 wt. %.

In some embodiments, the one or more particulates, alone or in combination, may be present in the primer layer at a concentration, expressed in wt. % relative to the weight of the total primer layer. In some embodiments, the one or more particulates has a refractive index of greater than or equal to about 1.5, preferably greater than or equal to about 2.0, more preferably greater than or equal to about 2.4, or any range or value therein between.

In some embodiments, the one or more particulates has a refractive index of about 1.4 to about 3, about 2 to about 3, or any range or value therein. In some embodiments, low-index filler particles, such as silica and $CaCO_3$, may be present in the primer layer at a concentration, expressed in wt. % relative to the weight of the total primer layer, of about 0.1 wt. % to about 15 wt. %, preferably from about 1 wt. % to about 10 wt. %.

Polymeric Hollow Particle

In some embodiments, a primer layer according to the present disclosure comprises one or more polymeric hollow particles. The polymeric hollow particles may have any suitable composition, size (average diameter), or specific gravity, and may be present at any suitable concentration, to improve the thermal insulation properties of the primer layer over conventional primer layers which do not contain any polymeric hollow particles, while affording acceptable reflectivity (e.g., hiding power), blocking resistance, adhesion, blistering resistance, and film quality.

In some embodiments, the one or more polymeric hollow particles may comprise, consist essentially of, or consist of a polymeric shell and a core. In some embodiments, the core is an air core or its precursor, for example a highly water-swollen gel from which the air core is formed upon removal of water during or after coating.

In some embodiments, the one or more polymeric hollow particles comprises a polymeric shell comprising a polymer selected from the group consisting of polyacrylates, polymethacrylates, polystyrenes, polyesters, melamine formaldehyde condensates, polyolefins, polyureas, polyurethanes, and blends or copolymers thereof. In some embodiments, the polymeric shell is crosslinked. In some embodiment, the polymeric shell may comprise an inorganic network such as silica formed by for example, a sol-gel process. Exemplary polymeric hollow particles may be prepared according to the disclosures found in C. J. McDonald et al., 99 *Adv. Colloid & Interface Sci.* 181-213 (2002) (DOI:10.1016/80001-8686(02)00034-9) and W. Wichaita et al., 58 *Indus. Eng'g Chem. Res.* 20880-20901 (2019) (DOI: 10.1021/acs.iecr.9b02330), the entireties of which are hereby incorporated by reference.

In some embodiments, the one or more polymeric hollow particles may have an average diameter or $D_{50}$ from about 0.1 µm to about 2 µm, from about 0.1 µm to about 1 µm, from about 0.3 µm to about 5.0 µm, or from about 0.5 µm to about 2 µm. In some embodiments, the air core of the polymeric hollow particle has a diameter of from about 0.1

μm to about 1.0 μm, or about 0.15 μm to about 1 μm. Preferably the hollow particles or its core has a narrow particle size distribution. A series of polymeric hollow particles may be readily available from for examples, Dow Chemicals and Taiwan Hopax Chemicals.

In some embodiments, the one or more polymeric hollow particles may have an average diameter or $D_{50}$ of greater than or equal to about 0.1 μm, greater than or equal to about 0.2 μm, greater than or equal to about 0.3 μm, greater than or equal to about 0.4 μm, greater than or equal to about 0.5 μm, greater than or equal to about 0.6 μm, greater than or equal to about 0.7 μm, greater than or equal to about 0.8 μm, greater than or equal to about 0.9 μm, greater than or equal to about 1 μm, greater than or equal to about 1.5 μm, greater than or equal to about 2 μm, greater than or equal to about 2.5 μm, greater than or equal to about 3 μm, greater than or equal to about 3.5 μm, greater than or equal to about 4 μm, greater than or equal to about 4.5 μm, greater than or equal to about 5 μm, greater than or equal to about 10 μm, or any range or value therein between.

In some embodiments, the one or more polymeric hollow particles may have an average diameter $D_{50}$ of less than or equal to about 5 μm, less than or equal to about 4.5 μm, less than or equal to about 4 μm, less than or equal to about 3.5 μm, less than or equal to about 3 μm, less than or equal to about 2.5 μm, less than or equal to about 2 μm, less than or equal to about 1.5 μm, less than or equal to about 1 μm, less than or equal to about 0.9 μm, less than or equal to about 0.8 μm, less than or equal to about 0.7 μm, less than or equal to about 0.6 μm, less than or equal to about 0.5 μm, less than or equal to about 0.4 μm, less than or equal to about 0.3 μm, less than or equal to about 0.2 μm, or any range or value therein.

In some embodiments, the one or more polymeric hollow particles may comprise, consist essentially of, or consist of a single polymeric hollow particle composition (e.g., NTR-50 ($D_{50}$=about 0.16 μm)), or two or more polymeric hollow particle compositions (e.g., Hopax NTR-50 ($D_{50}$=0.16 μm), Hopax NTR-100 ($D_{50}$=about 0.82 μm), Dow ROPAQUE™ ULTRA-E ($D_{50}$=about 0.35 μm), and Dow ROPAQUE™ TH-1000 ($D_{50}$=about 1.0 μm), etc.).

In some embodiments, the one or more polymeric hollow particles, alone or in combination, may be present in the primer layer at a concentration, expressed in wt. % relative to the weight of the total primer layer, from about 2 wt. % to about 30 wt. %, from about 5 wt. % to about 25 wt. %, more preferably from about 10 wt. % to about 25 wt. %.

Back-Coat

Figure 1C:
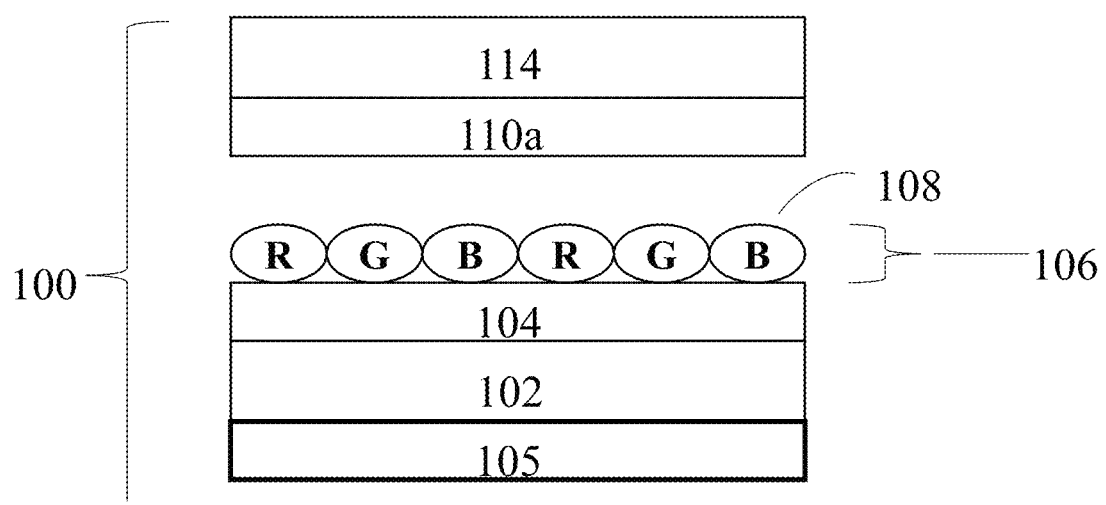
FIG. 1C is a schematic illustration of a microcapsule imaging sheet according to the present disclosure, with a primer coating between the microcapsule layer and the substrate, as well as a back coating on the other side of the substrate.

Referring to FIG. 1C, in some embodiments, an opaque back-coat 105 is coated onto a second surface of the substrate 102, wherein the first surface is coated with the primer layer 104. Such embodiments may improve image resolution, fresh Dmax, and energy efficiency, as well as eliminate the risk of light leakage through the top imaging sheet, which would cause premature exposure of the underlying image sheets in a media stack. In some embodiments, the opaque back-coat comprises essentially the same ingredients as those in the primer layer (e.g., white particulates, filler particulates, or hollow polymeric particles), having any of the same compositions or sizes disclosed above, or present at any of the concentrations disclosed above, relative to the total weight of the back-coat. For instance, in some embodiments, the back-coat comprises a hollow polymeric particle. In some embodiments, the back-coat further comprises one or more particulates (e.g., particulates selected from the group consisting of: $TiO_2$, silica, $BaSO_4$, $CaSO_4$, BN, $CaCO_3$, $Al_2O_3$, AN, and $Ca_3(PO_4)_2$). In some embodiments, the back-coat comprises a binder (e.g., a polymeric binder).

In some embodiments, the back-coat further comprises an annihilating dye or pigment for the incipient light. In some embodiments, the annihilating dye or pigment is a black dye or pigment such as carbon black. Commercially available examples of carbon black include, but are not limited to, NW-KAB85 (($D_{50}$=0.15 μm) from Taiwan Nanotechnology Corp.).

The back-coat may be of any thickness suitable to ensure easy handling of the media sheet and an acceptable annihilation of the incipient light. In some embodiments, the thickness of the back-coat is from about 2 μm to about 30 μm, from about 3 μm to about 20 μm, or from about 5 μm to about 15 μm.

In some embodiments, the back-coat may have a thickness of greater than or equal to about 1 μm, greater than or equal to about 1.5 μm, greater than or equal to about 2 μm, greater than or equal to about 2.5 μm, greater than or equal to about 3 μm, greater than or equal to about 3.5 μm, greater than or equal to about 4 μm, greater than or equal to about 4.5 μm, greater than or equal to about 5 μm, greater than or equal to about 6 μm, greater than or equal to about 7 μm, greater than or equal to about 8 μm, greater than or equal to about 9 μm, greater than or equal to about 10 μm, greater than or equal to about 15 μm, greater than or equal to about 20 μm, greater than or equal to about 25 μm, greater than or equal to about 30 μm, greater than or equal to about, or any range or value therein.

In some embodiments, the back-coat may have a thickness of less than or equal to about 50 μm, less than or equal to about 45 μm, less than or equal to about 40 μm, less than or equal to about 35 μm, less than or equal to about 30 μm, less than or equal to about 25 μm, less than or equal to about 20 μm, less than or equal to about 15 μm, less than or equal to about 10 μm, less than or equal to about 5 μm, or any range or value therein.

In some embodiments, the back-coat comprises the black pigment or dye at a concentration, relative to the total weight of the back-coat, of about 0.1 wt. % to about 50 wt. %, about 1 wt. % to about 30 wt. %, or about 3 wt. % to about 20 wt. %, or any range or value therein.

In some embodiments, the back-coat comprises the black pigment or dye at a concentration, relative to the total weight of the back-coat, of greater than or equal to about 0.1 wt. %, greater than or equal to about 0.2 wt. %, greater than or equal to about 0.3 wt. %, greater than or equal to about 0.4 wt. %, greater than or equal to about 0.5 wt. %, greater than or equal to about 0.6 wt. %, greater than or equal to about 0.7 wt. %, greater than or equal to about 0.8 wt. %, greater than or equal to about 0.9 wt. %, greater than or equal to about 1 wt. %, greater than or equal to about 2 wt. %, greater than or equal to about 3 wt. %, greater than or equal to about 4 wt. %, greater than or equal to about 5 wt. %, greater than or equal to about 6 wt. %, greater than or equal to about 7 wt. %, greater than or equal to about 8 wt. %, greater than or equal to about 9 wt. %, greater than or equal to about 10 wt. %, greater than or equal to about 15 wt. %, greater than or equal to about 20 wt. %, greater than or equal to about 25 wt. %, or any range or value therein.

In some embodiments, the back-coat comprises the black pigment or dye at a concentration, relative to the total weight of the back-coat, of less than or equal to about 60 wt. %, less than or equal to about 55 wt. %, less than or equal to about 50 wt. %, less than or equal to about 45 wt. %, less than or equal to about 40 wt. %, less than or equal to about 35 wt. %, less than or equal to about 30 wt. %, less than or equal to about 25 wt. %, less than or equal to about 20 wt. %, less than or equal to about 15 wt. %, less than or equal to about 10 wt. %, or any range or value therein.

In some embodiments, the back-coat is deposited on the second surface of the substrate by vapor deposition, sputtering, spraying, or wet coating. In some embodiments, the back-coat may not comprise a polymeric binder. In some embodiments, the back-coat may not comprise a black pigment or dye. In some embodiments, the back-coat may comprise a metal, metal nitride, metal oxide, metal carbide, or metal boride film (e.g., Al, Cr, Ag, Ni, Au, Cu, Ti, and combinations thereof, etc.) vapor-coated or sputter-coated onto the second surface of the substrate (e.g., the first substrate).

While the foregoing terms are believed to be well understood by one of ordinary skill in the art, the following definitions are set forth to facilitate explanation of the presently disclosed subject matter.

The term "a" or "an" may refer to one or more of that entity, i.e. can refer to plural referents. As such, the terms "a" or "an", "one or more" and "at least one" are used interchangeably herein. In addition, reference to "an element" by the indefinite article "a" or "an" does not exclude the possibility that more than one of the elements is present, unless the context clearly requires that there is one and only one of the elements.

Reference throughout this specification to "one embodiment", "an embodiment", "one aspect", or "an aspect" means that a particular feature, structure or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

As used herein, the terms "about" or "approximately" when preceding a numerical value indicates the value plus or minus a range of 10% of the value.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present application and relevant art and should not be interpreted in an idealized or overly formal sense unless expressly so defined herein. While not explicitly defined below, such terms should be interpreted according to their common meaning.

For purposes of the present disclosure, the term "color density" or "color optical density" refers to the media ability to reflect light, where the greater the dye's light reflection in certain colors, the higher the color optical density (i.e., the more intense the color). The lower the dye's light reflection, the lower the color density (i.e., the less intense the color).

For purposes of this disclosure, the term "maximum color density" (or "Dmax") refers to the maximum color density achieved by a dye after a given development time as measured by a reflective Spectrodensitometer FD-5 from Konica Minolta. For example, Dmax, fresh or fresh Dmax refers to the maximum color density of the developed image sheet as measured immediately after development, and Dmax, t refers to the maximum color density as measured after the developed image sheet is conditioned for a period of time (t).

For purposes of this disclosure, the term "leuco dye" refers to a chemical dye which can alternate between two chemical forms, one of which is colorless. The transformation from colorless to color form may be reversible or irreversible and may be induced by a Lewis acid or base, or changes in temperature, pH, irradiation, or redox state. Useful developers include, but are not limited to, phenols, phenolic resins, salicylic acid, oxalic acid, phthalic acid, organophosphonic acids, organosulfonic acids, and their zincated derivatives. Zincated salicylate derivatives and novolac resins are particularly useful for their high rate of color formation and the color fastness of the dye formed thereof.

Methods of Preparing an Imaging Sheet

In another aspect, which may be combined with any other aspect or embodiment, the present disclosure relates to a method of preparing an imaging sheet, the method comprising: (i) coating a first surface of a first substrate with a primer layer according to any of the embodiments disclosed herein, to produce a primer-coated first substrate; (ii) contacting the primer layer of the primer-coated first substrate with a microcapsule layer to produce a microcapsule-coated first substrate; (iii) contacting the microcapsule-coated first substrate with a developer layer to produce a developer-coated first substrate; and (iv) contacting the developer layer of the developer-coated first substrate with a second substrate to produce an imaging sheet.

In some embodiments, the present disclosure relates to a method of preparing an imaging sheet, the method comprising: (i) coating a first surface of a first substrate with a primer layer according to any of the embodiments disclosed herein, to produce a primer-coated first substrate; (ii) contacting the primer layer of the primer-coated first substrate with a microcapsule layer to produce a microcapsule-coated first substrate; (iii) contacting a second substrate with a developer layer to produce a developer-coated second substrate; and (iv) contacting the developer layer of the developer-coated second substrate with the microcapsule layer of the microcapsule-coated first substrate to produce an imaging sheet.

In some embodiments, a second primer layer may be positioned between the second substrate and the developer layer.

In any of the above embodiments, the method of producing an image sheet may further comprise: (v) contacting a second surface of the first substrate with a back-coat, wherein the second surface of the first substrate is opposite the first surface of the first substrate. In some embodiments, the contacting in (v) is performed by physical vapor deposition, sputtering, chemical vapor deposition, lamination, or spin-coating.

Methods of Using Primer Layers and Imaging Sheets Comprising the Same

In another aspect, which may be combined with any other aspect or embodiment, the present disclosure relates to methods of using primer layers according to any of the above-discussed embodiments. In another aspect, which may be combined with any other aspect or embodiment, the present disclosure relates to methods of using imaging sheets according to any of the above-discussed embodiments.

For example, in some embodiments, a method of imaging or printing comprises exposing an imaging sheet comprising a primer layer according to any of the embodiments disclosed herein and a microcapsule layer according to any of the embodiments disclosed herein, to heat, pressure, or radiation, wherein the exposing is sufficient to release leuco dye from the microcapsules in the microcapsule layer to produce an image.

In some embodiments, the present disclosure relates to methods of improving one or more properties of an imaging sheet, comprising including in (or adding to) the imaging sheet a primer layer according to any embodiment disclosed herein. In some embodiments, the one or more properties comprises one or more of: Dmax; fresh Dmax; Dmax, t; Dmin; image resolution; hiding power; blocking resistance; adhesion; reflective optical density; and thermal insulation performance.

Unless explicitly indicated otherwise, all specified embodiments, features, and terms intend to include both the recited embodiment, feature, or term and equivalents thereof.

Reference will now be made in detail to various specific embodiments contemplated by the present disclosure. While various embodiments are described herein, it will be understood that it is not intended to limit the present technology to the described embodiments. On the contrary, it is intended to cover alternatives, modifications, and equivalents as may be included within the spirit and scope of the technology as defined by the appended claims.

EXAMPLES

Materials and Methods

TABLE 1

| Materials Used in Exemplary Embodiments | |
|---|---|
| Material | Description |
| Versa TL502 | Sulfonated polystyrene from Nouryon Corp. |
| CYMEL ® 385 | Methylated high imino melamine resin with a low degree of alkylation from Allnex Corp. |
| NW-YOT05 | Yellow (Pigment Yellow 155) water-based ink dispersion (D50 of 0.14 μm) from Taiwan Nanotechnology Corporation |
| NW-MEA12 | Magenta (Pigment Violet 19) water-based ink dispersion (D50 of 0.14 μm) from Taiwan Nanotechnology Corporation |
| DESMODUR ® N-100 | Aliphatic polyisocyanate from Covestro Corp. |
| AEROSOL ™ OT | Sodium bis (2-ethylhexyl) sulfosuccinate surfactant from Cytec Corp. |
| TRITON ™ X-114 | Nonionic surfactant from Dow Corp. |
| IRGANOX ® 1035 | Primary phenolic antioxidant and heat stabilizer from BASF |
| GSB1202 | Spacer particle from Guidewin Corp. |
| CELLOSIZE ™ QP-52000H | Hydroxyethyl cellulose from Dow Corp. |
| METHOCEL ™ K15M | Hydroxypropyl methyl cellulose from DuPont |
| SILWET ® L-7001 | Silicone surfactant from Momentive Performance Materials |
| SILWET ® L-7604 | Silicone surfactant from Momentive Performance Materials |
| JONCRYL ® FLX 5040 | Latex binder from BASF |
| M-35 | Latex binder (D50 of 0.12 um) from TOA Resin Corp. |
| TAMOL ™ 731 DP | A hydrophobic copolymer dispersant from Dow Chemical |
| TAMOL ™ 165A | A hydrophobic copolymer dispersant from Dow Chemical |
| PVA2488 | Polyvinyl alcohol from Sinochem Corp. |
| PVA205 | Polyvinyl alcohol from Sinochem Corp. |
| CAB-O-SPERSE ® 1015A | An aqueous dispersion of CAB-O-SIL ® L-90 (fumed silica) from Cabot Corp. |
| CAB-O-SPERSE ® 2012A | An aqueous dispersion of CAB-O-SIL ® M-5 (fumed silica) from Cabot Corp. |
| Eastman AQ ™ 55S | Water-dispersible polyester resin from Eastman |
| TIPURE ™ 6341 | Titanium dioxide water-based dispersion from DuPont |
| NW-WNQ11 | Rutile Titanium dioxide water-based dispersion (D50 = 0.34 μm) from Taiwan Nanotechnology Corp. |
| NTR-50 | Polymeric hollow particle (D50 = 0.13 μm) from HOPAX Corp. |
| NTR-100 | Polymeric hollow particle (D50 = 0.30 μm) from HOPAX Corp. |
| ROPAQUE ™ ULTRA-E Opaque Polymer | Polymeric opacifier hollow particle ($D_{50}$ = 0.38 μm) from Dow Corp. |
| MK-WD42515 | Calcium carbonate water-based dispersion ($D_{50}$ = 0.11 μm) from Taiwan Nanotechnology Corp. |
| NW-KAB85 | Carbon black water-based pigment dispersion ($D_{50}$ = 0.15 μm) from Taiwan Nanotechnology Corp. |
| FOAMSTAR ® ST 2410 | Star molecule-based deformer from BASF |
| PRIMAL ™ AC-261T | Acrylic latex emulsion from Dow Chemical |

TABLE 2

Internal Phase of Photosensitive Microcapsule

| Green Photosensitive Capsule | Dry Parts |
|---|---|
| TMPTA (trimethylolpropane triacrylate) | 90.00 |
| TPGDA (tripropylene glycol diacrylate) | 10.00 |
| THEED (N,N,N',N'-tetrakis(2-hydroxyethyl)ethylenediamine) | 0.20 |
| DIDMA (2,6-diisopropyl-N,N-dimethylaniline) | 3.00 |
| Magenta Leuco Dye (CAS: 50292-95-0 from Synmedia-chem) | 20.00 |
| (MTBS) mercaptobenzothiazole disulfide | 0.50 |
| Green-sensitive photoinitiator (1-heptyl-2-[3-(1-heptyl-3,3-dimethyl-1,3-dihydro-2H-indol-2-ylidene)-propenyl]-3,3-dimethyl-3H-indolium isobutyl triphenyl borate) | 0.075 |
| DESMODUR ® N-100 | 8.00 |
| DBTDL (dibutyltin dilaurate) | 0.05 |

Preparation of Photosensitive Microcapsules

Photosensitive microcapsules were prepared with the materials listed in Table 2 and by the process as described below:

1. Into a 1000 ml stainless steel beaker, 220 parts of water and 8 parts of Versa TL502 sulfonated polystyrene (dry) were added and thoroughly mixed.
2. 10 parts of pectin (polygalacturonic acid methyl ester) was slowly sifted into the mixture and stirred overnight at room temperature (5001000 rpm).
3. The pH was adjusted to 7.5 with 10% sodium carbonate and the mixing speed was increased to 1750 rpm.
4. The internal phase as shown in Table 2 was added over a period of 1530 seconds, the resultant mixture was stirred for 30 minutes and 11 parts of a 9.1% aqueous solution (pH adjusted 7.0) of DETA (diethylene triamine) were added and allowed to react for 30 minutes at 25° C. followed by an hour at 40° C.
5. A solution comprising 19.9 parts of CYMEL® 385 and 40 g of water (pH adjusted to 6.0) were added, and the mixture was allowed to react at 70° C. for an additional 2 hours.
6. 15.23 parts of a 34.3% aqueous of sodium sulfate were added, after stirred for 10 minutes, 1.97 parts of CYMEL® 385 and 10 parts of water were added, and the mixture was allowed to react at 70° C. for an additional 1 hour.
7. The mixing speed was reduced to 600 rpm, the pH was adjusted to 9.5 using a 20% NaOH solution, and the resultant reaction mixture was stirred overnight at room temperature.

The microcapsules thus prepared were washed extensively with water and centrifuged to remove the excess of the water-soluble polymers and additives in the aqueous phase. The particle size ($D_{50}$) of the purified/washed microcapsules, as measured by HORIBA LA-960 Particle Size Analyzer, is about 6 μm.

Preparation of Control Microcapsule Sheet—Microcapsule Coatings on PET (MELINEXO® 339) without a Primer or Back-Coat

TABLE 3

Compositions of Microcapsule Fluids

| Ingredient | Dry parts |
|---|---|
| Green-sensitive microcapsule (45% solid) | 100.00 |
| Calcium Carbonate (33% solid) (Particle size, $D_{50}$ = 0.12 um) | 5.00 |
| CELLOSIZE ™ QP-52000H | 0.51 |
| AEROSOL ™ OT | 0.05 |

TABLE 3-continued

Compositions of Microcapsule Fluids

| Ingredient | Dry parts |
|---|---|
| TRITON ™ X-114 | 0.20 |
| SILWET ® L*-7001 | 0.20 |
| SILWET ® L*-7604 | 0.20 |
| TAMOL ™ 731 DP | 2.00 |
| Joncryl FLX 5040 | 10.00 |
| Eastman AQ ™ 55S | 8.00 |

The coating fluid as shown in Table 3 was adjusted to 33 wt. % solid by addition of water and was dispersed thoroughly using a low shear mixer, then was coated on a 2 mil. white PET substrate (MELINEX® 339) with a Myrad bar and dried in an 80° C. oven for 10 minutes. The dry coating thickness was about 8 μm, as measured by a Mitutoyo thickness gauge.

Preparation of Color Developer Coatings

To prepare color developer coatings, the composition shown in Table 4 was coated on a 1 mil. transparent PET film with a Myrad bar and dried in an 80° C. oven for 10 minutes with a target dry coating thickness of about 13 μm.

TABLE 4

Composition of Developer Coating

| Ingredients | Dry parts |
|---|---|
| Resin Developer RD9870A from Richful, China | 98.00 |
| CAB-O-SPERSE ® 1015A from Cabot, USA | 0.86 |
| PVA1799 from Sinochem, China | 1.14 |

Preparation of Control Image Sheets—Image Sheets Without a Primer or Back-coat

The microcapsule films and the developer films prepared as discussed above were laminated together with a Tamerica roll laminator TCC2700 with the temperature, pressure, and speed settings of 100° C., 3.621 Kgf/170 mm, and 0.368 m/min, respectively, to form various photosensitive imaging sheets, as described in the Examples below.

Example 1. Effect of Primer Coatings on Blocking Resistance, Reflectivity, Hiding Power, Adhesion, and Blistering To test the relative effects of hollow particles present in the primer layer, primer formulations comprising 30 wt. % $TiO_2$ particles (TIPURE™ 6431 from DuPont), 5 wt. % of PVA 205, 0-10 wt. % of hollow particle NTR-50 ($D_{50}$=0.25 µm, from Hopax Chemicals), and wt. % of M35 latex as the buffer. The primer formulations were coated onto MELINEX® 339 substrate with a Myrad rod. As a comparison, a primer layer comprising 5 wt. % (dry) silica CAB-O-SIL® 1015 was also prepared. Each coating was between 6.3 µm and 6.7 µm thick.

For blocking tests, each sample was pressed against the back of a MELINEX® 339 substrate for 24 hr at 10 kg/100 cm$^2$ at 40° C. and 85% relative humidity, and the percentage of the test area with observable damage marks was recorded.

To test the hiding power, primer layers with various concentrations of hollow particle NTR-50 were coated onto the top surface of MELINEX® 339, and the optical density was measured against a black surface. A lower reflective optical density indicates a higher hiding power, to hide the color of the black background with an optical density of about 2.0.

As shown in Table 5, all samples coated with the primer coating showed a dramatic increase in hiding power or reduction of reflective optical density (a black OD of 0.0-0.02 or a reflectivity of 95.5-100%) as compared with the control without any primer coating. It's also evident that all the samples coated with primer coatings comprising 5-10 wt. % of NTR-50 showed a dramatic improvement in the blocking resistance or reduction in the % of area with observable damage marks after the blocking test as compared with the one comprising only silica particles, an additive commonly used to improve blocking resistance of coatings.

All coatings showed also showed excellent water resistance (blistering test) and adhesion to PET 339 (tape test).

Example 2. Primer Layers of Reduced Thickness

The same primer layers described in Example 1 were prepared, except that the coating thickness was reduced to 2.9±0.3 µm. To achieve images of a high color density, the leuco dyes released from the microcapsule must diffuse into the developer layer as much as possible to convert the leuco dyes from the leuco form to the color form. A thin, impermeable primer layer is highly preferable because it reduces the risk of undesirable dye diffusion or absorption into the primer layer, which is on the opposite side of the microcapsule layer in the imaging sheet of the following structure: PET/primer layer/microcapsule layer/developer layer/PET. Thin primer layer compositions were prepared, the compositions comprising 0.4-1.1 wt. % of hydroxypropylmethyl cellulose (HPMC) (DuPont METHOCEL™ K15M) as the thickener to improve the coating quality, and various M35 latex concentrations as the buffer (to bring the compositions up to 100 wt. %). The thin primer layer compositions were then were coated onto MELINEX® 339. The samples were subjected to the adhesion, hiding power, and blocking tests described above (see Example 1).

As shown in Table 6, all the films prepared from the HPMC-containing primer formulations showed excellent coating quality, adhesion, blistering resistance, and hiding power (reflective black optical density≤0.01 or reflectivity of ≥97.7%, as measured against a black background with an optical density of >2.0), even after the thickness of the primer layer was reduced to 2.9±0.3 µm. All four primer layers in Example 2 also showed a significant improvement in blocking resistance, with the percentage of area with observable damage marks after the blocking test significantly reduced from <30% (see Example 1-2) to <10%.

TABLE 5

Hiding Power and Blocking Resistance Concentration of Hollow Particles (Example 1)

| Example 1 (6.5 + 0.2 µm) | | Reflective Optical Density | | | | Adhesion Test | Blocking Resistance (% area)* |
|---|---|---|---|---|---|---|---|
| | | Cyan (C) | Magenta (M) | Yellow (Y) | Black (K) | | |
| Control | MELINEX® 339 only | 0.08 | 0.06 | 0.02 | 0.07 | NA | NA |
| Example 1-1** | 5 wt. % CAB-O-SPHERSE® 1015A | 0 | 0 | 0 | 0 | Pass | >90% |
| Example 1-2** | 5.0 wt. % NTR-50 | 0.02 | 0.01 | 0.01 | 0.02 | Pass | <30% |
| Example 1-3** | 7.5 wt. % NTR-50 | 0 | 0 | 0 | 0 | Pass | 30~35% |
| Example 1-4** | 10.0 wt. % NTR-50 | 0.01 | 0 | 0.01 | 0 | Pass | 30~35% |

*The % area with observable damage after the blocking test (weight: 10 Kg/100 cm$^2$, 85% RH/40° C. for 24 hr)

**MELINEX® 339 coated with a primer layer comprising 30 wt. % of $TiO_2$ (TIPURE ™ 6431), and 5.0~10.0 wt. % of NTR-50.

TABLE 6

Hiding Power for Thickener-Containing Primer Layers (Example 2)

| Example 2 (2.9 ± 0.3 μm) | | Reflective Optical Density | | | | Adhesion Test | Blocking Resistance (% area)* |
|---|---|---|---|---|---|---|---|
| | | Cyan (C) | Magenta (M) | Yellow (Y) | Black (K) | | |
| Control | MELINEX ® 339 only | 0.08 | 0.06 | 0.02 | 0.07 | N/A | N/A |
| Example 2-1 | 0.4 wt. % HPMC | 0.02 | 0 | 0.01 | 0.01 | Pass | <10% |
| Example 2-2** | 0.6 wt. % HPMC | 0.02 | 0.01 | 0.01 | 0.01 | Pass | <10% |
| Example 2-3** | 0.8 wt. % HPMC | 0.02 | 0.01 | 0.01 | 0.01 | Pass | <10% |
| Example 2-4 | 1.1 wt. % HPMC | 0.02 | 0.01 | 0.01 | 0.01 | Pass | <10% |

*The % area with observable damage after the blocking test (Weight: 10 Kg/100 cm², 85% RH/40° C. for 24 hr)
**MELINEX ® 339 coated with a primer layer comprising 30 wt. % of TIPURE ™ 6431, 5.0 wt. % of NTR-50 and 0.4~1.1 wt. % of HPMC-K15M

Example 3. Primer Layers with Various Particulate Concentration (30-37 wt. %)

The same primer layers described for Example 2 were prepared, except that the $TiO_2$ (TIPURE™ 6431) concentration was increased from 30 wt. % to 37 wt. %, and the M35 latex concentration varied as the buffer (to bring the compositions to 100 wt. %). The coating thickness was 2.5 μm to 3.2 μm on MELINEX® 339. The samples were subjected to the same hiding power, blocking resistance, adhesion, and blistering resistance tests discussed above (see Examples 1 and 2).

As shown in Table 7, all primer layers thus prepared showed excellent hiding power (reflective black optical density≤0.01 or reflectivity of ≥97.7%, compared to reflective black optical density of 0.07 or reflectivity of 85.1% for the bare PET MELINEX® 339), suggesting that a higher concentration of $TiO_2$ particles enabled production of highly reflective primer layers with a thickness as low as 2.5 μm. This higher reflectivity implies a higher photo-speed, as the reflected light serves as the extra light source to expose the microcapsules. The color strength of the developed image is also improved as more light of the appropriate color will be reflected back to the observer's eye during image evaluation.

Referring to Table 7, blocking resistance tests show that each of the primer layers exhibit good blocking resistance, with less than 5% of the load area showing very light marks. Primer layers having ≥32.5 wt. % $TiO_2$ showed slightly less tendency to stick to the edges of the PET 339 substrate without a release liner or coating, with only a slight blurring of the film at the edge of the loaded weight. All primer layers showed acceptable adhesion (i.e., passed the adhesion test), regardless of the $TiO_2$ concentration. All primer layers also showed good blistering resistance in the presence of two different test liquids: deionized water and water with 0.01 wt. % each of AEROSOL OT™ (sodium dioctylsulfosuccinate) and TRITON™ X-114 nonionic detergent (Sigma-Aldrich Inc. of Saint Louis, MO).

Example 4. Effect of Hollow Particle Concentration and Size

To test the effect of hollow particle size and concentration on film performance, five primer layers with varied hollow particles (of different sizes and concentrations) were prepared as described in Example 3, except that the type and concentration of hollow particles shown in Table 8 were used. Their hiding powers, as indicated by the reflective optical density measured against a black substrate (OD=2.0, black), are also shown in Table 8.

TABLE 7

Hiding Power and Blocking Resistance of Primer Layers with Various TIPURE™ 6431 Concentrations (Example 3)

| Example 3 (2.85 ± 0.35 μm) | | Reflective Optical Density | | | | Adhesion Test | Blocking Resistance (% area)* |
|---|---|---|---|---|---|---|---|
| | | Cyan (C) | Magenta (M) | Yellow (Y) | Black (K) | | |
| Control | MELINEX ® 339 only | 0.08 | 0.06 | 0.02 | 0.07 | N/A | N/A |
| Example 3-1 | 30.0 wt. % $TiO_2$ | 0.02 | 0 | 0.01 | 0.01 | Pass | <5% |
| Example 3-2 | 32.5 wt. % $TiO_2$ | 0.02 | 0 | 0.01 | 0.01 | Pass | <5% |
| Example 3-3* | 35.0 wt. % $TiO_2$ | 0.01 | 0 | 0.01 | 0.01 | Pass | <5% |
| Example 3-4* | 37.0 wt. % $TiO_2$ | 0.01 | 0 | 0.01 | 0.01 | Pass | <5% |

*The % area with observable damage after the blocking test (Weight: 10 Kg/100 cm², 85% RH/40° C. for 24 hr)
**MELINEX ® 339 coated with a primer layer comprising 5.0 wt. % of NTR-50, 0.6 wt. % of HPMC-K15M, 30-37 wt. % of $TiO_2$, and binder M35 as the buffer.

TABLE 8

Hiding Power and Blocking Resistance of Primers with Varying Hollow Particle Sizes and Concentrations (Example 4)

| Example 4 (2.6~4.0 μm) | | Reflective Optical Density | | | | Adhesion Test | Blocking Resistance (% area)* |
|---|---|---|---|---|---|---|---|
| | | Cyan (C) | Magenta (M) | Yellow (Y) | Black (K) | | |
| Control | MELINEX ® 339 only | 0.08 | 0.06 | 0.02 | 0.07 | N/A | N/A |
| Example 4-1** | 10.0 wt. % NTR-50 | 0.02 | 0.01 | 0.01 | 0.01 | Pass | ~10% |
| Example 4-2** | 12.2 wt. % NTR-50 | 0.02 | 0.01 | 0.01 | 0.01 | Pass | ~10% |
| Example 4-3* | 14.3 wt. % NTR-50 | 0.01 | 0.01 | 0.01 | 0.01 | Pass | ~10% |
| Example 4-4* | 10.0 wt. % NTR-100 | 0.01 | 0.00 | 0.01 | 0.01 | Pass | <5% |
| Example 4-5** | 14.3 wt. % NTR-100 | 0.02 | 0.00 | 0.00 | 0.01 | Pass | <5% |

*The % area with observable damage after the blocking test (Weight: 10 Kg/100 cm$^2$, 85% RH/40° C. for 24 hr)
**MELINEX ® 339 only coated with a primer layer comprising 30 wt. % of TIPURE ™ 6431, and 55~59.3 wt % of M35 Binder As shown in Table 8, primer layers with hollow particles NTR-50 and NTR-100 ($D_{50}$=0.9 μm) showed excellent hiding power compared to bare MELINEX® 339 substrate, evidenced by the low reflective optical density (or high reflectivity, 97.7%), regardless of the hollow particle size or concentration. Further, all primer layers exhibited acceptable blocking resistance. Primer layers containing 10 wt. % or 14.3 wt. % NTR-100 showed slightly better blocking resistance than analogous primer layers containing NTR-50 particles.

All films passed the dry adhesion test, indicating acceptable adhesion of the primer layers to the MELINEX® 339 substrate, regardless of the hollow particle size or concentration. However, primer layers containing NTR-50 hollow particles showed slightly better film quality upon visual observation, when compared to analogous primer layers containing NTR-100 hollow particles, at the same concentrations.

Example 5. Effect of Mixed Hollow Particle Sizes on Primer Quality and Performance Blocking Resistance, Hiding Power, Adhesion, and Blistering Resistance To test the effect of including hollow particles with a bimodal size distribution on primer layer hiding power, blocking resistance, adhesion, and blistering resistance, primer layer formulations were prepared according to Table 9, with each primer layer containing NTR-50 ($D_{50}$=0.25 μm) and NTR-100 ($D_{50}$=0.9 μm), at a combined concentration of 10.0 wt. %, but at different NTR-50: NTR-100 ratios. All the primer coatings of Example 5 comprise 0.8 wt. % of HPMC-K15M and were coated with a target dry thickness of about 2.8 μm on MELINEX® 339, following the same procedure described in Example 4.

As shown in Table 9, all the primer coatings of Example 5 show a good adhesion to the PET substrate, and the samples with hollow particles showed an improved blocking resistance and hiding power when compared with to a sample without any hollow particles (see Example 5-0). Although all the primer coatings exhibited an acceptable coating quality, one coating higher concentration of larger-size particles (NTR-100) showed a slightly inferior coating uniformity.

TABLE 9

Primer Formulations with Bimodal Hollow Particle Size Distributions

| Example 5 (2.8 ± 0.3 μm) | Primer Composition (wt. %, dry) | | | | Adhesion Test | Blocking Resistance (% area)* | Reflective OD (K)* |
|---|---|---|---|---|---|---|---|
| | NTR-50 | NTR-100 | TIPURE ™ 6431 | M35 | | | |
| Example 5-0 | 0 | 0 | 36.46 | 62.55 | pass | >20% | 0.02 |
| Example 5-1 | 10 | 0 | 32.8 | 56.3 | Pass | <5% | 0.01 |
| Example 5-2 | 9 | 1 | 32.8 | 56.3 | Pass | <5% | 0.01 |
| Example 5-3 | 8 | 2 | 32.8 | 56.3 | Pass | <5% | 0.01 |
| Example 5-4 | 7 | 3 | 32.8 | 56.3 | Pass | <5% | 0.01 |
| Example 5-5 | 5 | 5 | 32.8 | 56.3 | Pass | <5% | 0.01 |

*The % area with observable damage after the blocking test (Weight: 10 Kg/100 cm$^2$, 85% RH/40° C. for 24 hr)
**Measured against a black background with an OD (K) of about 2.0

Also observed was that all primer formulations showed good blistering resistance as judged by the size of the water stain observed after exposed to deionized water and an aqueous solution containing 0.5 wt. % each of AEROSOL OT™ and TRITON™ X-114. The primer formulations containing blends of different-sized hollow particles (e.g., Examples 5-3 and 5-4, NTR-50/NTR-100=8/2 to 7/3) appear to show desirable coating quality and blocking resistance while exhibiting excellent reflectivity, film quality, and blistering resistance.

Thermal Insulation Performance

Figure 2A:
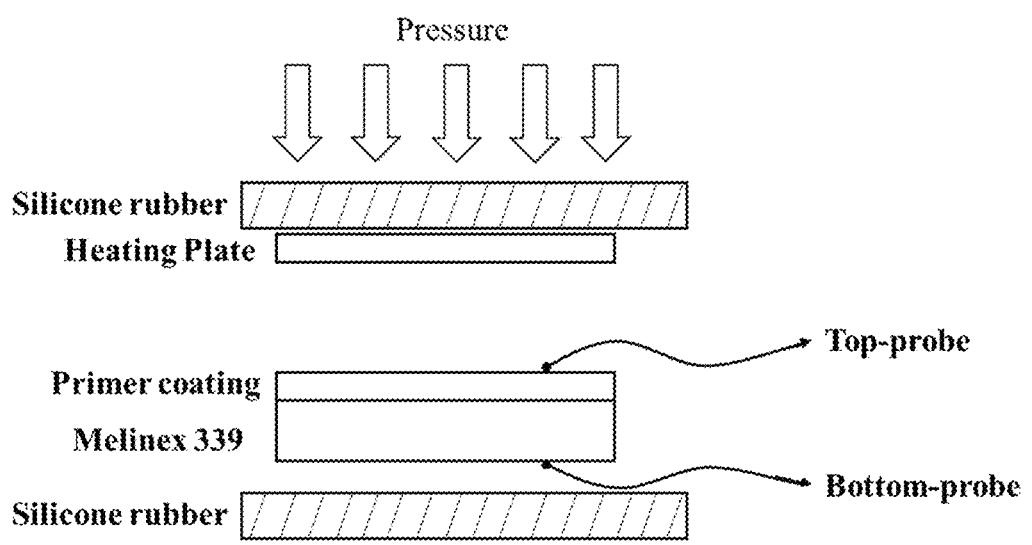
FIG. 2A is a schematic illustration of a fixture setup with thermocouples for measuring a resting temperature drop through a primer layer according to the present disclosure.

To test the thermal insulation properties of primer layers containing hollow particles, primer formulations of Examples 5-0 (no hollow particle), 5-1 (10 wt. % of NTR-50) and 5-5 (5 wt. % of NTR-50 and 5 wt. % of NTR-100) were used. The temperature difference between the top and bottom of an imaging sheet comprising the primer layers was measured as a function of heating time at a preset fixture temperature of 70° C., using the apparatus as shown in FIG. 2A, where thermal probes were placed at the top and bottom of the imaging sheet.

Figure 2B:
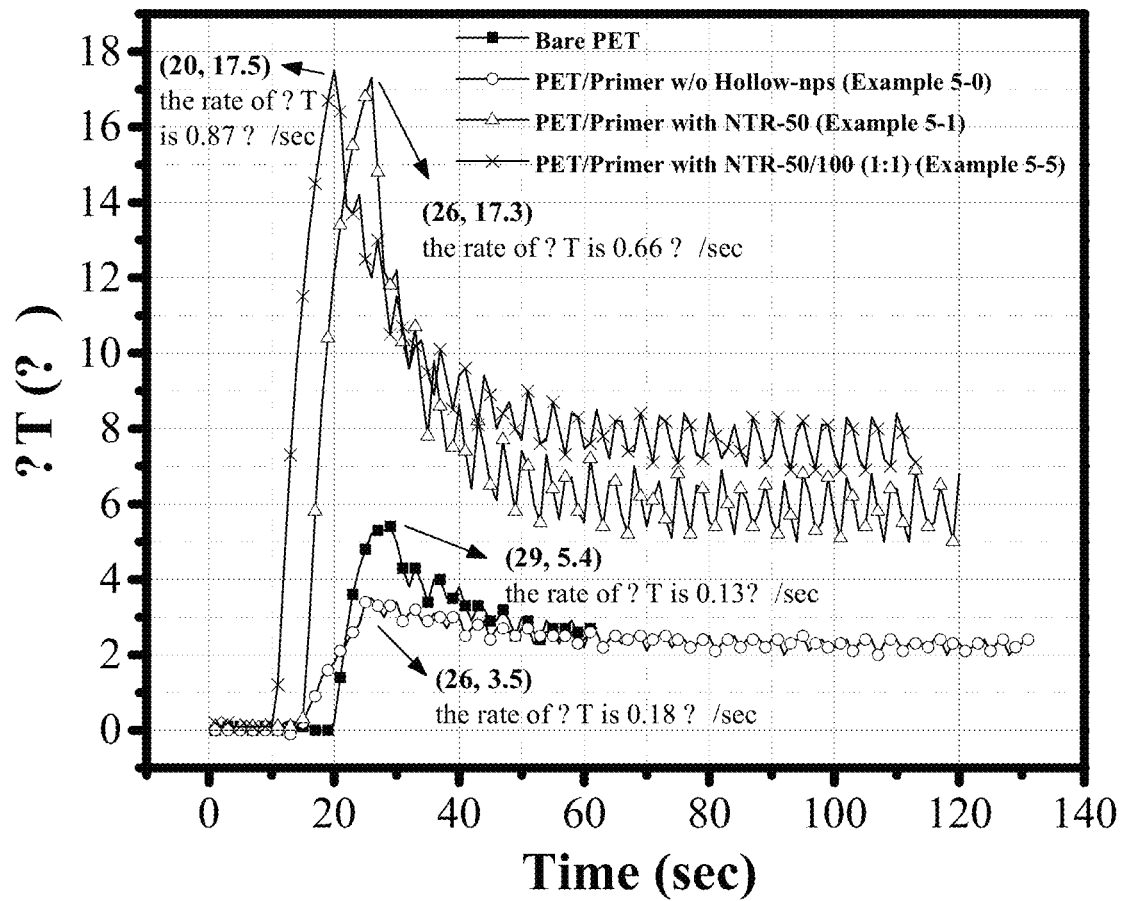
FIG. 2B shows a plot of temperature difference between the top of the primer layer and the bottom of the primer layer substrate as a function of heating time.

Referring to FIG. 2B, the temperature difference between the top and bottom of the primer layer increases significantly with the addition of hollow particles and increases yet further with the addition of a blend of hollow particles. For primer layers containing hollow particles, the temperature difference reaches a maximum of approximately 17° C. after about 20 sec, compared to a difference of about 3.5° C. after 26 sec and 5.4° C. after 29 sec for primer layers having no hollow particles and the bare MELINEX® 339 substrate, respectively. As indicated in FIG. 2B, the presence of hollow particles greatly increases both the rate of temperature increase and the equilibrium temperature on the top surface of the primer layer (or the bottom of the image layer, if an image layer is coated on the top of the primer).

Figure 3A:
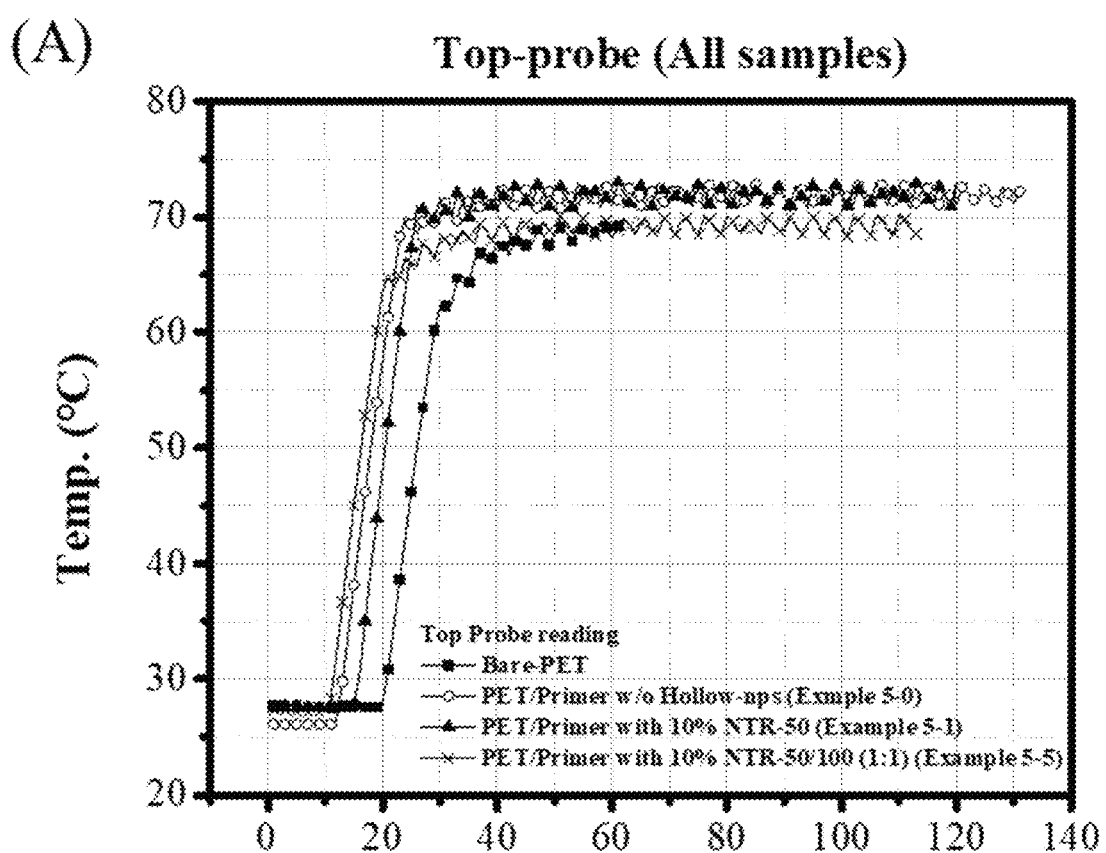
FIGS. 3A, 3B, 3C, 3D, 3E and 3F show the actual temperature difference between the top of the primer layer and the bottom of the primer layer substrate as a function of heating time and as a function of primer layer composition, for imaging sheets comprising primer layers according to the present disclosure.
Figure 3B:
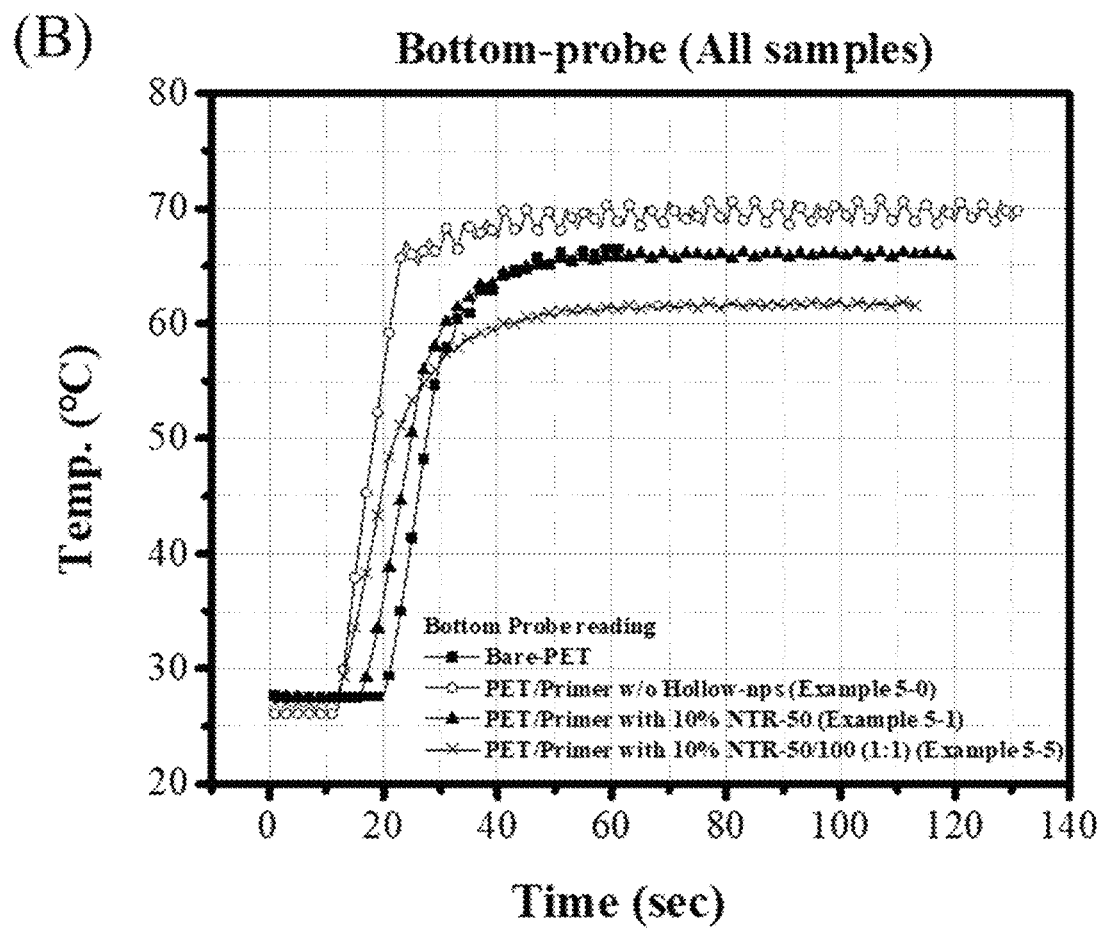
Figure 3C:
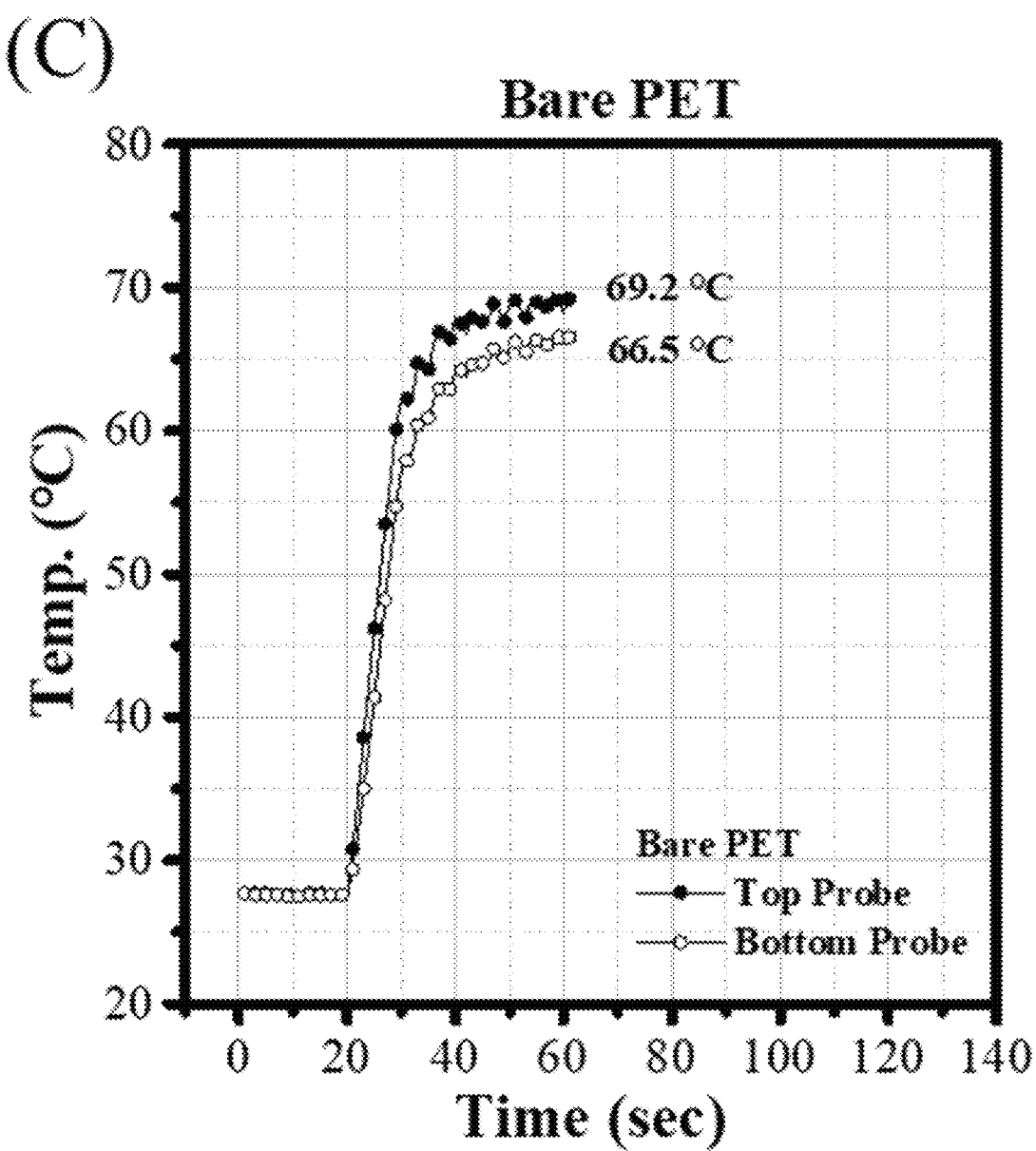
Figure 3D:
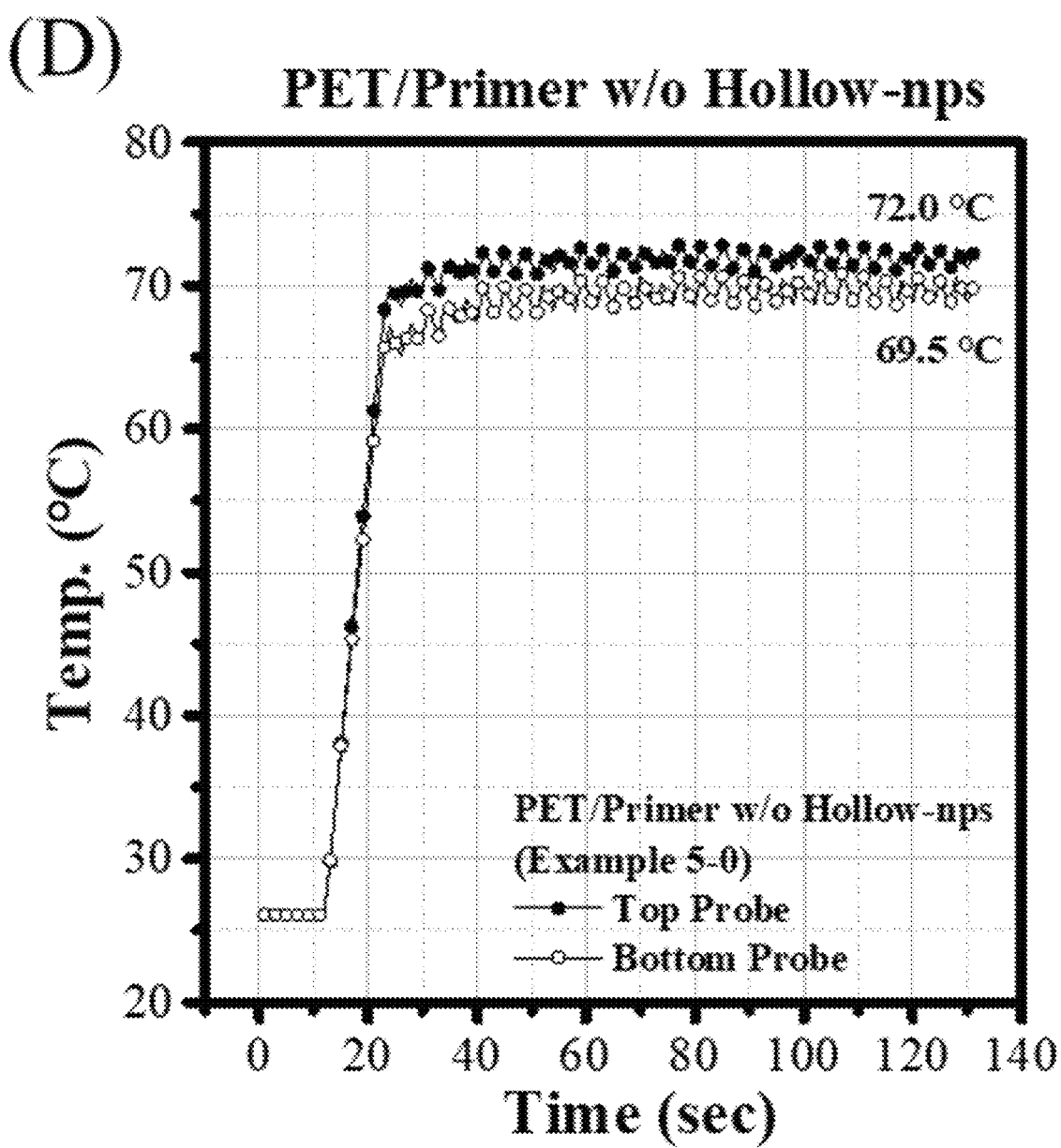
Figure 3E:
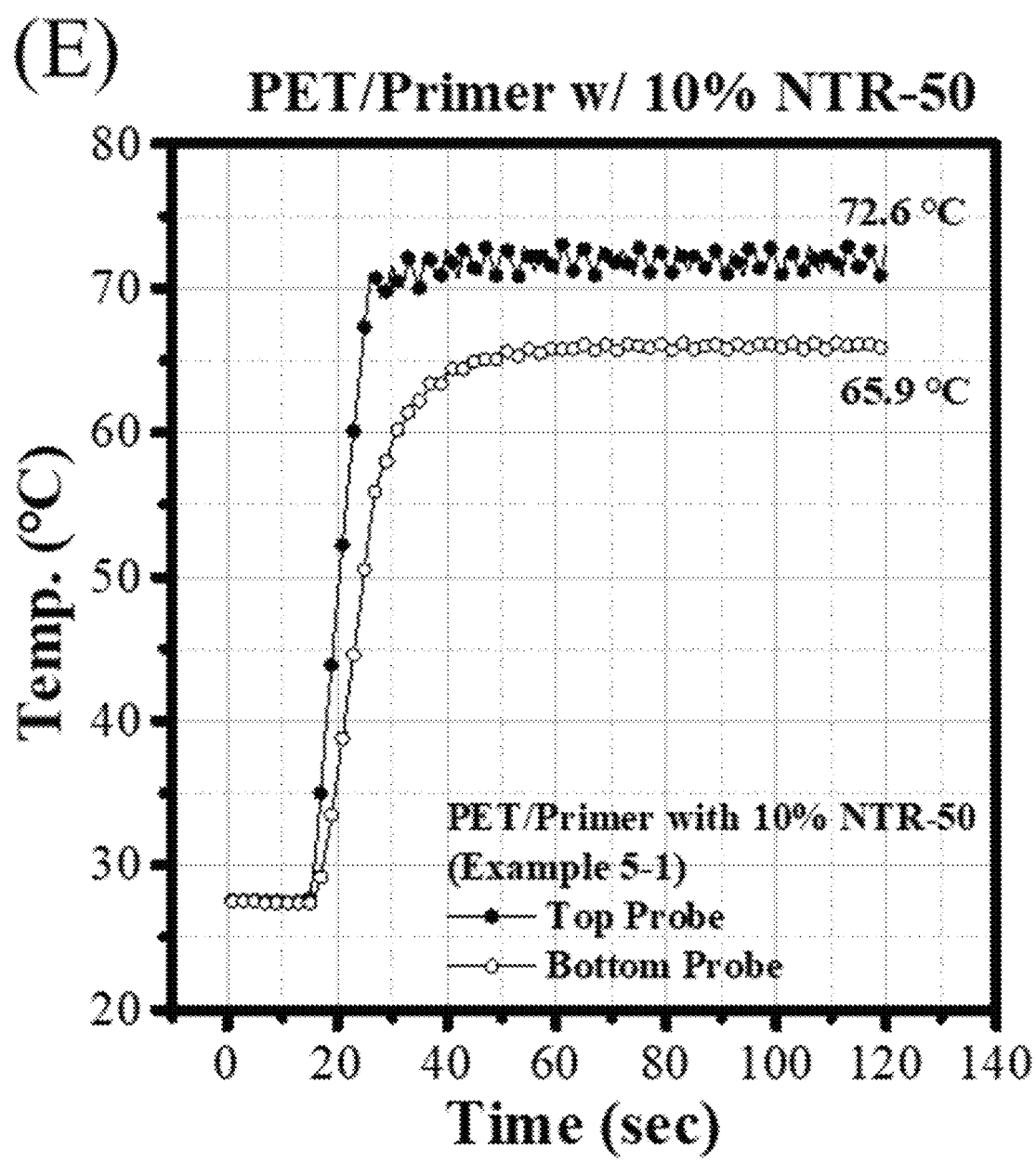
Figure 3F:
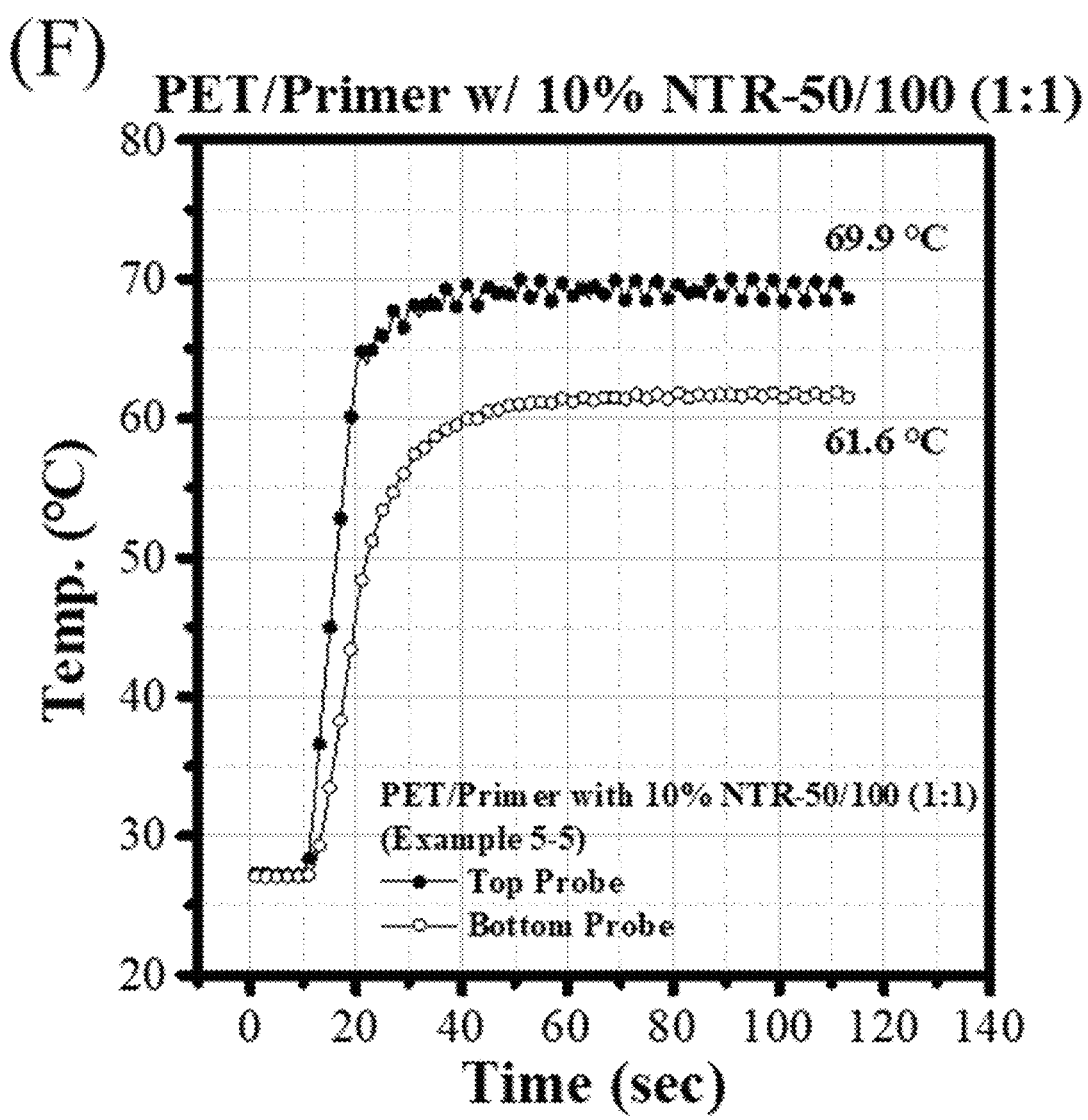

The actual temperature differences between the top and bottom probes for each sample is shown in FIGS. 3A-3F. The slight cyclical deviations in temperature at the top probe stem from the cycling of the heater by the relay control (which shuts off the heater at 70° C.). Consistent with the results shown in FIG. 2B, the equilibrium temperature difference between top and bottom probes is greatest for the primer layers having a blend of NTR-50/NTR-100 hollow particles (Example 5-5, 8.3° C., FIG. 3F), followed by the primer layer having only NTR-50 hollow particles (Example 5-1, 6.7° C., FIG. 3E), which are much higher than the temperature differences observed for the formulations having no hollow particles (Example 5-0, 2.5° C., FIG. 3D) or no primer layer (2.7° C., FIG. 3C). FIGS. 3A and 3B overlay temperature versus time plots for all top probe readings and all bottom probe readings, respectively.

Thus, the presence of hollow particles in the primer layer effectively minimizes loss of thermal energy from the primer layer (e.g., leakage into the substrate). Further, primer layers having a blend of different hollow particles sizes appear to afford better insulation and heating efficiency than primer layers having a single hollow particle size.

Example 6. Effect of Fixture Temperature and Hollow Particle Composition on Color Development To test the effect of processing parameters (e.g., fixture temperature) and hollow particle composition (e.g., ratio of NTR-50 to NTR-100), on color development, microcapsule imaging sheets were prepared by coating a magenta capsule layer (8 μm thickness; 15 phm PERGASCRIPT® Red I6B in microcapsules having a $D_{50}$ of 5-6 μm) with the primer layers (2-3 μm, 1 pass corona treated) according to Examples 5-1 and 5-4, comprising 10 wt. % hollow particles at NTR-50: NTR-100 ratios of 10/0 and 7/3, respectively. A control experiment (Example 6-0) was prepared using a primer layer of Example 5-0 without any hollow particles. The resulting microcapsule imaging sheet was laminated under low pressure with a developer sheet (15 μm developer RD9870/15% Novolac 586 on 1-mil clear PET) at room temperature. The prepared media were developed with a development fixture at various pre-set temperatures (60° C., 70° C., and 80° C.).

Figure 4A:
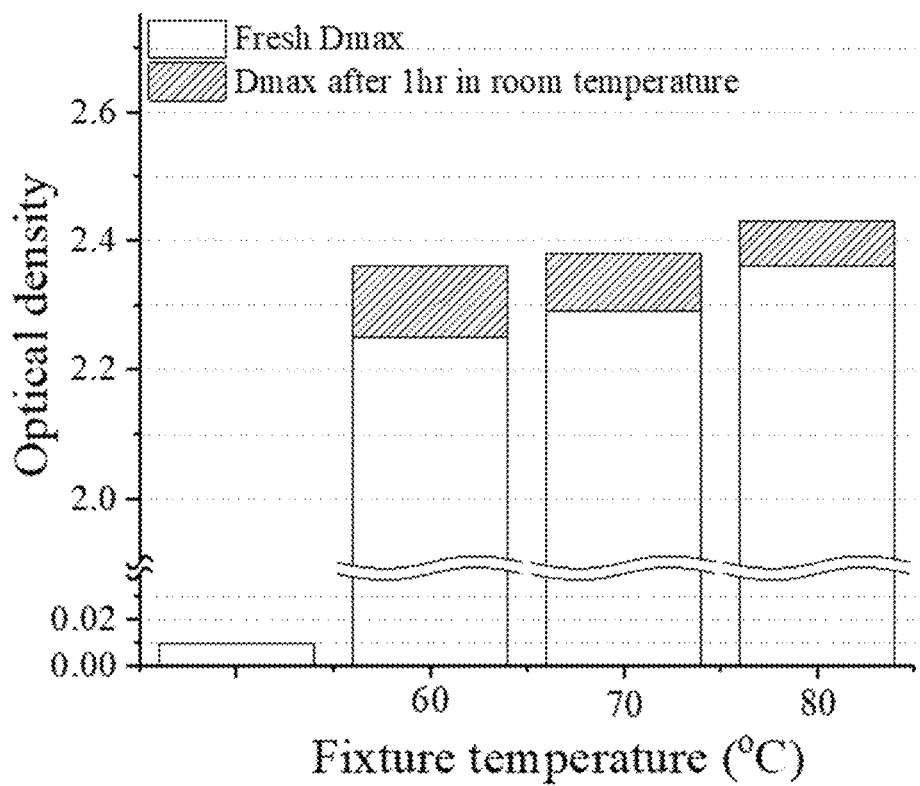
FIG. 4A shows a plot of color density (Dmax) versus fixture temperature for a magenta microcapsule layer coated on a primer layer having about 10% NTR-50 hollow particles.

Referring now to FIG. 4A, the fresh Dmax of the media with the primer 5-1 (10% NTR-50 in the primer) increases from about 2.25 to about 2.35 with increased fixture temperature (60° C. to 80° C.). After cooling to room temperature, the Dmax continues to increase for approximately 1 hr and reaches a final Dmax value of 2.35 (60° C.) to about 2.43 (80° C.). Assuming the Dmax after 1 hr of fixture development represents maximum conversion of the leuco dye, then the dye conversion immediately after fixture development is calculated to be 93.6% (60° C.) to 94.7% (80° C.).

Figure 4B:
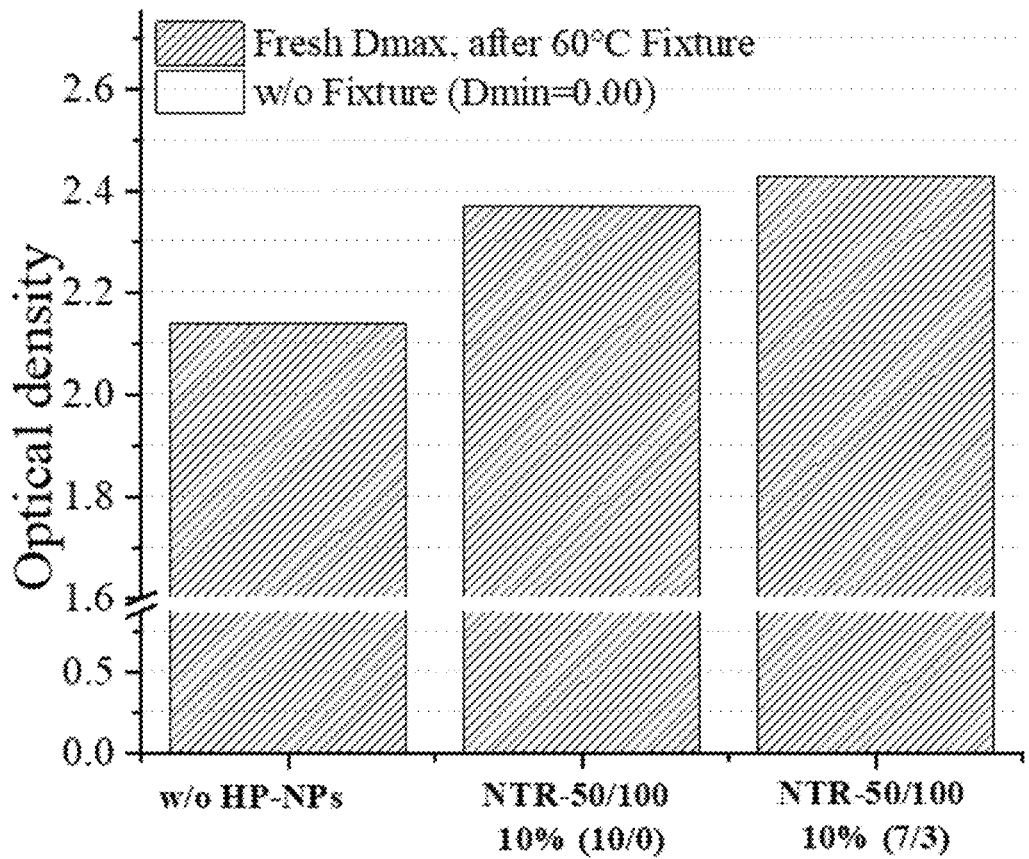
FIG. 4B shows a plot of color development (fresh Dmax) versus primer layer composition for a magenta microcapsule layer coated on a primer layer having different ratios of NTR-50 hollow particles (about 0.25 µm diameter) and NTR-100 hollow particles (about 0.9 µm diameter).

Referring to FIG. 4B, the primer particle composition may further improve the initial dye conversion and afford higher fresh Dmax. FIG. 4B shows the Dmax for the control media with the primer without hollow particles is about 2.2, while the media with the primer layers according to Example 5-1 (NTR-50 only) and Example 5-4 (NTR-50: NTR-100 of about 7:3) showed a significant improvement in fresh Dmax (about 2.37 and 2.48, respectively). Without being bound to any particular theory, this approximately 10% increase in Dmax is believed to result from improvements in thermal insulation realized by the hollow particles, preventing loss of thermal energy from the active dye development zone.

Example 7. Effect of Primer Composition on Color Density and Color Development

To test the effect of primer layer composition on color development and color density, the microcapsule imaging layer comprising magenta leuco dye as shown in Table 1 was coated on the primer layers derived from compositions comprising various concentration of NTR-50, NTR-100, and TIPURE™ 6431, as shown in Table 10. The microcapsule sheet was laminated with the developer sheet having a composition according to Table 4. The fixture temperature was held at 60° C. for color development, and the maximum color density was measured immediately after pressure development (Dmax, fresh), 4 hr after development (Dmax, 4 hr), and 12 hr after development (Dmax, 12 hr). The results are shown in Table 10 and FIGS. 5A-5B.

TABLE 10

Effect of Primer Composition on Dmax

| Example 7 (2.8 ± 0.3 μm) | Primer Composition (parts, dry) | | | | Dmax, fresh | Dmax, 4 hr | Dmax, 12 hr |
|---|---|---|---|---|---|---|---|
| | NTR-50 | NTR-10 | TIPURE™ 6431 | M35 | | | |
| Control, no primer | 0 | 0 | 0 | 0 | 1.6 | 1.95 | 2.12 |
| Example 7-0 | 0 | 0 | 0 | 99.1 | 1.53 | 1.88 | 1.96 |
| Example 7-1 | 0 | 0 | 30 | 69.1 | 1.68 | 2.02 | 2.15 |
| Example 7-2 | 16 | 4 | 22.8 | 56.3 | 1.82 | 2.13 | 2.19 |

Figure 5A:
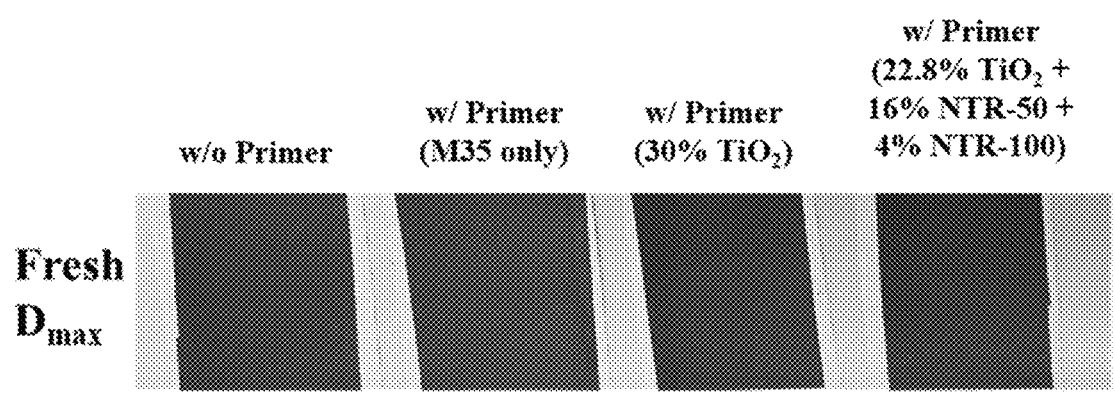
FIG. 5A shows optical images of imaging sheets immediately after development (Dmax (fresh)) as a function of the primer layer composition.
Figure 5B:
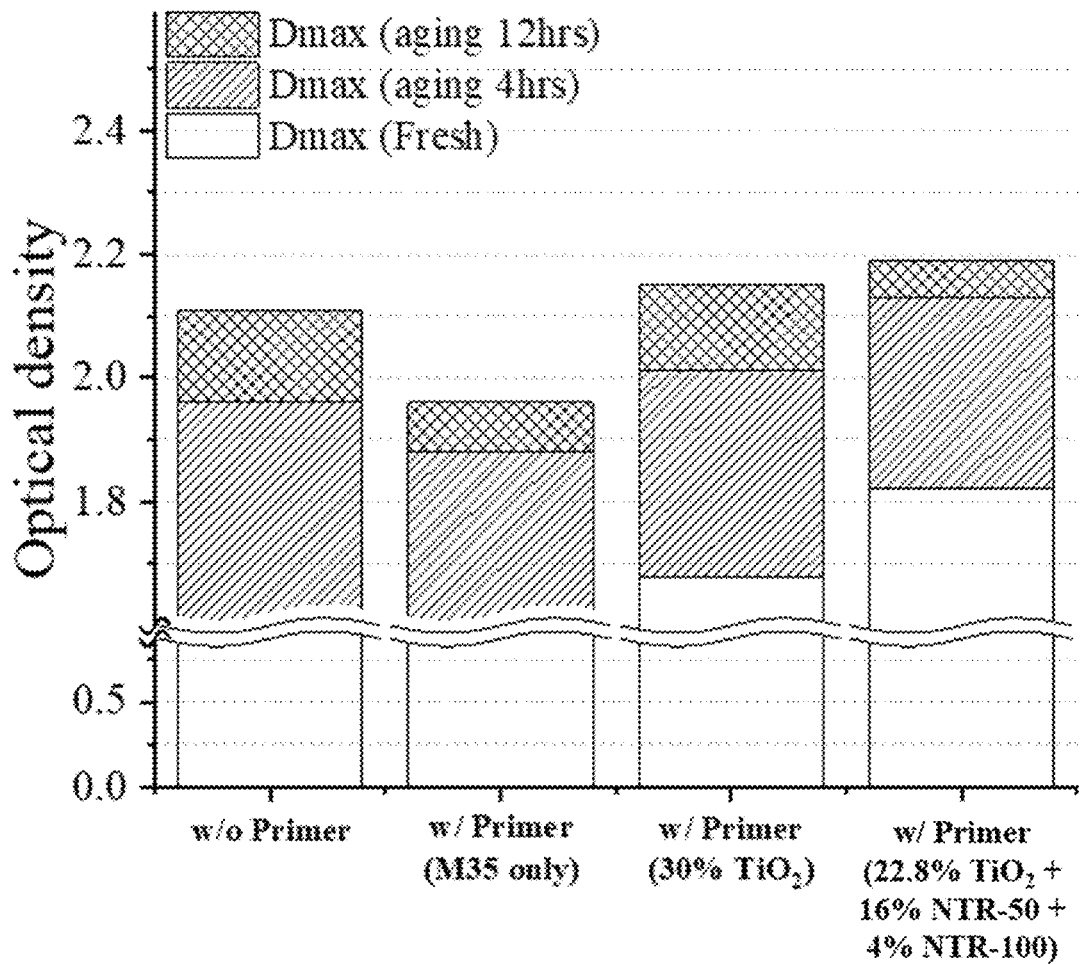
FIG. 5B shows results of testing for color density (Dmax) and color development immediately after development (Dmax (fresh)), 4 hours after development (Dmax, 4 hr), and 12 hours after development (Dmax, 12 hr), as a function of the primer layer composition.

FIG. 5A shows optical images of the freshly developed imaging sheets, corresponding to the Dmax, fresh values shown in Table 10 and FIG. 5B. Meanwhile, FIG. 5B shows color development (optical density) immediately after development (Dmax (fresh)), and after 4 hours (Dmax, 4 hr)

and 12 hours (Dmax, 12 hr). As shown in FIGS. 5A-5B and Table 10, the primer layer containing 22.8 wt. % $TiO_2$, 16.0 wt. % NTR-50, and 4.0 wt. % NTR-100 afforded higher Dmax (fresh), Dmax (4 hr), and Dmax (12 hr) than microcapsule layers coated directly onto the substrate (MELINEX® 339), or onto primer layers comprising only M35 or M35+$TiO_2$. Thus, the addition of $TiO_2$ and hollow particles significantly improves the fresh Dmax and final Dmax values. Without being bound to any particular theory, it is believed that the presence of 22-23 wt. % $TiO_2$ (Example 7-1) in the primer layer affords: (1) higher reflectance, allowing more color to be detected by the viewer's eye; and/or (2) a higher capsule rupture efficiency due to increase in modulus of the medium or concentration of stress at the microcapsule-primer interface. The addition of hollow particles NTR-50 and NTR-100 (Example 7-2) further significantly improved the Dmax, particularly the freshly developed Dmax. Without being bound to any particular theory, it is believed that the presence the hollow particles significantly improved the thermal efficiency of the media and in turn the Dmax, even at a fixture temperature as low as 60° C.

Example 8. Effect of Black Back-Coat on the Premature Exposure of the Second Imaging Sheet in a Media Stack A primer coating comprising 30 (dry) parts of NW-WNQ11 $TiO_2$ dispersion (54.73% solid), 11.05 (dry) parts of MK-WD42515 $CaCO_3$ dispersion (33.16% solid), 37.80 (dry) parts of M35 latex, 20.0 (dry) parts of ROPAQUE™ ULTRA-E hollow particle (29.89% solid), 0.15 (dry) parts of TAMOL™ 165A, 0.75 (dry) parts of CELLOSIZE™ QP-52000H, 0.05 (dry) parts of SILWET® L-7604 and 0.1 (dry) parts of FOAMSTAR® ST2410 was coated on the first surface of MELINEX® 339 with a dry thickness of 2.4+0.1 µm.

On the second surface of the MELINEX® 339 (the opposite side of the primer-coated substrate), back-coats comprising 30.0 (dry) parts of NW-WNQ11 $TiO_2$ dispersion (54.73% solid), 3 parts (dry) of CAB-O-SPERSE® 1015A Fumed Silica Dispersion (11.9% solid), 0-10 parts (dry) of NW-KAB85 Carbon Black Dispersion (27% solid), 35.55-41.55 (dry) parts of PRIMAL™ AC-261T (51.24% solid), 20.0 (dry) parts of ROPAQUE™ ULTRA-E hollow particle (29.89% solid), 0.15 (dry) parts of TAMOL™ 165A, 1.0 (dry) parts of CELLOSIZE™ QP-52000H, 0.05 (dry) parts of SILWET® L-7604 and 0.1 (dry) parts of FOAMSTAR® ST2410 was coated on the first surface of MELINEX® 339 with a dry thickness of 5.0+0.1 µm.

The microcapsule imaging layer was coated onto the primer layer and the resultant microcapsule sheet was laminated with the developer sheet as described in Example 7 to obtain an imaging media sheet. Two imaging sheets were then stacked together with the developer sheet facing up, after which the stack was exposed through a neutral density step-wedge with a green LED of 14.3 mW/cm² for 1-30 sec from the top media sheet. The bottom media sheet was then developed with a pressure fixture, and the optical density of each step was recorded as shown in FIG. 6 and Table 11.

Figure 6:
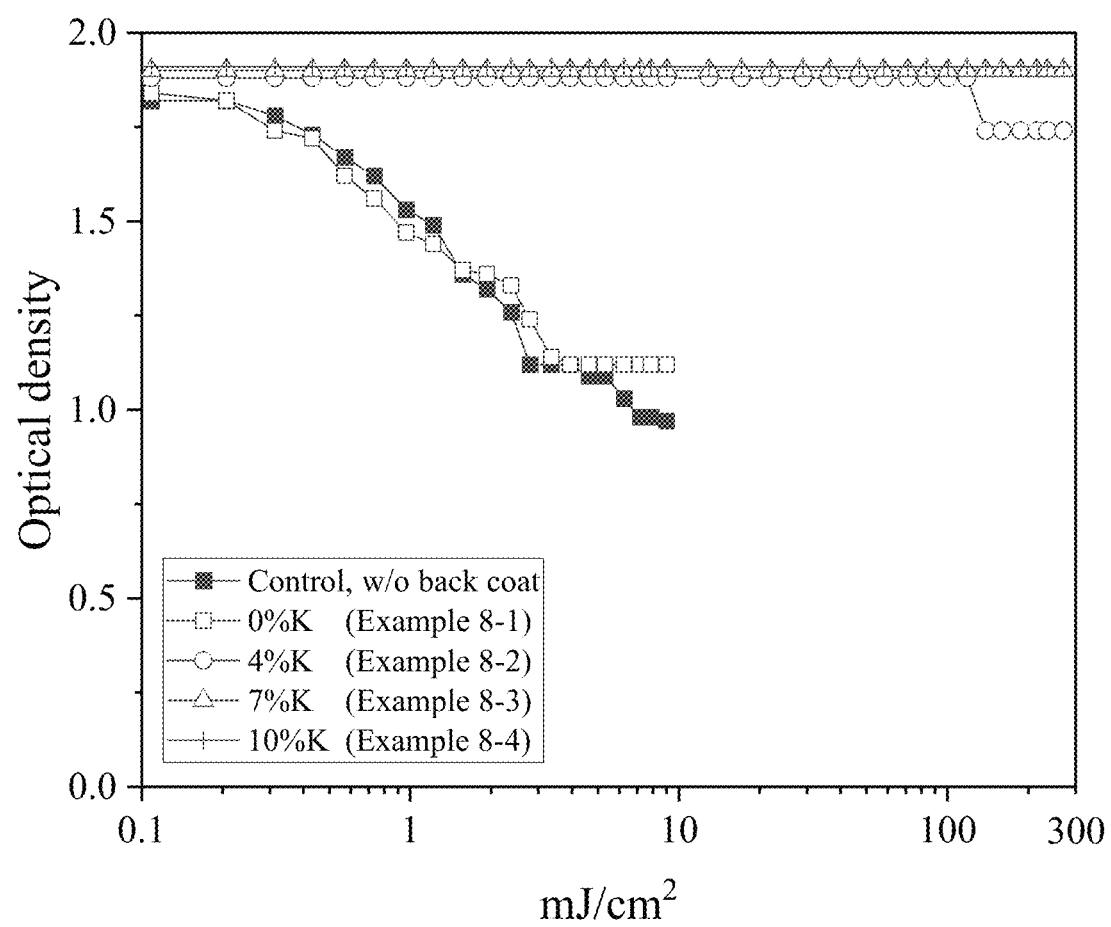
FIG. 6 shows a plot of optical density versus exposure energy (mJ/cm$^2$) for microcapsule imaging sheets according to the present disclosure without a back-coat (control) and with a back-coat comprising different concentrations of carbon black (% K).

Referring to FIG. 6 and Table 11, the control media sheet without any back-coat was prematurely exposed through the top media sheet with an $E_{10}$ (exposure energy required to lose 10% of optical density of the bottom media sheet) of about 0.3 mJ/cm² and an exposure time of 1 second. Indeed, the bottom media sheet actually completely over-exposed with an exposure time of 30 seconds. With a back-coat comprising 30 wt. % of $TiO_2$ (Example 8-1), the $E_{10}$ of the bottom media sheet increased slightly to about 0.4 mJ/cm² but still was easily exposed prematurely through the top media sheet. With a back-coat comprising 30 wt. % of $TiO_2$ and 4 wt. % of a black pigment (NW-KAB85), the $E_{10}$ significantly increased to 154 mJ/cm² with an exposure time of 30 seconds. With a back-coat comprising 30 wt. % of $TiO_2$ and 10 wt. % of a black pigment (NW-KAB85), the $E_{10}$ further significantly increased to >271 mJ/cm² with an exposure time of 30 seconds. The bottom media sheet is essentially free from any premature light exposure during the exposure of the top media sheet when a back-coat comprising more than 4-7 wt. % of back pigment and 30 wt. % of $TiO_2$ is applied to the second surface of the substrate. As shown in Table 11, the Dmax of the media sheet comprising a black back-coat increases with increasing concentration of the black pigment.

TABLE 11

Effect of Back-coat Composition on the Premature Exposure of the Second Imaging Sheet

| Example 8 (5.1 ± 0.1 µm) | Composition (wt %, dry) | | | Dmax | $E_{10}$ (mJ/cm²)* 1 sec | $E_{10}$ (mJ/cm²)* 30 sec |
| --- | --- | --- | --- | --- | --- | --- |
| | NW-WNQ11 | NW-KAB85 | AC261T | | | |
| Control (w/o back coat) | — | — | — | 1.82 | ~0.3 | — |
| Example 8-0 | 30.0 | 0.0 | 45.55 | 1.84 | ~0.4 | — |
| Example 8-1 | 30.0 | 4.0 | 41.55 | 1.88 | N/A** | 154 |
| Example 8-2 | 30.0 | 7.0 | 38.55 | 1.90 | N/A** | >271 |
| Example 8-3 | 30.0 | 10.0 | 35.55 | 1.91 | N/A** | >271 |

*Energy required to lose 10% of Dmax of the second media sheet at 14.3 mW/cm² for 1 sec and 30 sec.
**No sign of any premature exposure or Dmax loss of the second media sheet was observed.

Example 9. Effect of Primer and Back-Coat on the Resolution of Imaging Sheets To test the effect of primer and back-coat on imaging sheet resolution, the same primer coating and back-coat as those described in Example 8 were used, except that in the back-coat, (dry) parts of M35 latex (instead of PRIMAL™ AC-261T) were used as the binder, and 20 parts (dry) of carbon black and 20 parts (dry) of $TiO_2$ were used the back-coat. The same green-sensitive microcapsule layer as used in Example 8 was coated on bare MELINEX® 339 (Capsule Sheet 9-1), MELINEX® 339 with primer (Capsule Sheet 9-2), and MELINEX® 339 with both primer and back-coat (Capsule Sheet 9-3). The resulting microcapsule sheets were laminated with the same developer sheet of Example 8 with a Tamerica roll laminator TCC2700 at 90° C., 3.621 Kgf/170 mm, and 0.368 m/min to form the media sheets of Example 9-1, 9-2, and 9-3 (corresponding to Capsule Sheets 9-1, 9-2, and 9-3, respectively).

The green photosensitive media sheets were exposed with a collimated light unit (Model ESPCOL60-W) for 1.7-4.0 sec at 0.8 mW/cm$^2$ through a PET photomask of black and white lines with varied line widths of 20 µm to 1000 µm. The exposed media sheets were developed as described in the previous examples, and the widths of the developed lines are shown in Tables 12A and 12B.

TABLE 12A

Effect of Primer and Back-coat on Black Line Width

| | | Black linewidth of the photomask used (µm) | | | | | | | | |
|---|---|---|---|---|---|---|---|---|---|---|
| | | 20 | 30 | 40 | 50 | 60 | 80 | 100 | 250 | 500 | 1,000 |
| | Corresponding Black linewidth of the media developed @0.8 mW/cm$^2$, 1.7 sec | | | | | | | | | |
| Example 9-1 | Control, MELINEX ® 339 only | X* | X* | 36.0 | 44.5 | 58.5 | 79.7 | 100.2 | 243.3 | 496.2 | 990.3 |
| Example 9-2 | Primer only | X* | X* | X* | 40 | 53 | 74 | 87 | 241 | 497 | 988 |
| Example 9-3 | Primer + Black back-coat | X* | 28.0 | 34.1 | 49.2 | 59.7 | 80.2 | 97.5 | 246.2 | 495.8 | 1001.3 |

*Broken or unrecognizable lines

TABLE 12B

Effect of Primer and Back-coat on White Line Width

| | | White linewidth of the photomask used (µm) | | | | | | | | |
|---|---|---|---|---|---|---|---|---|---|---|
| | | 20 | 30 | 40 | 50 | 60 | 80 | 100 | 250 | 500 | 1000 |
| | Corresponding White linewidth of the media developed @0.8 mW/cm$^2$, 4.0 sec | | | | | | | | | |
| Example 9-1 | Control, MELINEX ® 339 only | X* | 21.1 | 32.3 | 46.1 | 64.4 | 83.5 | 117.3 | 270.1 | 529.2 | 1026.5 |
| Example 9-2 | Primer only | 20.2 | 26.4 | 35.7 | 49.9 | 66.0 | 85.4 | 121.0 | 273.9 | 530.5 | 1026.5 |
| Example 9-3 | Primer + Black back-coat | X* | 26.0 | 30.0 | 43.7 | 52.0 | 79.9 | 99.8 | 255.3 | 501.0 | 1009.1 |

*Broken or unrecognizable lines

As it is evident from Table 12A that although the presence of the primer layer showed significant improvements in many aspects of the media performances as illustrated in Examples 1-7, it made the printing of fine black lines more difficult (Example 9-2). The addition of a black back-coat (Example 9-3) helps correct the disadvantage caused by the primer layer. In fact, media sheets comprising both primer and black back-coat showed a significantly improvements in the fine black line printability to as low as 28 µm (Example 9-3) as compared with the 36.0 and 40 µm of the Control (Example 9-1) and the one with only a primer coating (Example 9-2), respectively.

The effect of the primer and black back-coat on the printability of white fine lines is shown in Table 12B. It can be clearly seen that although the sample with only the primer layer (Example 9-2) showed the narrowest white line printability, the addition of the black back-coat (Example 9-3) showed the best overall white line printing linewidth control as it could best reproduce the line width of the photomask within a wider line-width range.

The compositions and methods illustratively described herein may suitably be practiced in the absence of any element or elements, limitation or limitations, not specifically disclosed herein. Thus, for example, the terms "comprising", "including," containing", etc. shall be read expansively and without limitation. Additionally, the terms and expressions employed herein have been used as terms of description and not of limitation, and there is no intention in the use of such terms and expressions of excluding any equivalents of the features shown and described or portions thereof. It is recognized that various modifications are possible within the scope of the disclosure claimed. Thus, it should be understood that although the present disclosure has been specifically disclosed by preferred embodiments and optional features, modification and variation of the disclosure embodied therein herein disclosed may be resorted to by those skilled in the art, and that such modifications and variations are considered to be within the scope of this disclosure.

Unless the context indicates otherwise, it is specifically intended that the various features of the invention described herein can be used in any combination. Moreover, the disclosure also contemplates that in some embodiments, any feature or combination of features set forth herein can be excluded or omitted. To illustrate, if the specification states that a complex comprises components A, B and C, it is specifically intended that any of A, B or C, or a combination thereof, can be omitted and disclaimed singularly or in any combination.

The disclosure has been described broadly and generically herein. Each of the narrower species and subgeneric groupings falling within the generic disclosure also form part of the compositions or methods. This includes the generic description of the compositions or methods with a proviso or negative limitation removing any subject matter from the genus, regardless of whether or not the excised material is specifically recited herein. The present technology is not to be limited in terms of the particular embodiments described in this application, which are intended as representative illustrations of individual aspects of the present technology. Many modifications and variations of this present technology can be made without departing from its spirit and scope, as will be apparent to those skilled in the art. Functionally equivalent compositions, methods, and devices within the scope of the present technology, in addition to those enumerated herein, will be apparent to those skilled in the art from the foregoing descriptions. Such modifications and variations are intended to fall within the scope of the present technology. It is to be understood that this present technology is not limited to particular methods, reagents, compounds or compositions, which can, of course, vary. It is also to be understood that the terminology used herein is for the purpose of describing particular embodiments only, and is not intended to be limiting.

One skilled in the art readily appreciates that the present disclosure is well adapted to carry out the objects and obtain the ends and advantages mentioned, as well as those inherent therein. Modifications therein and other uses will occur to those skilled in the art. These modifications are encompassed within the spirit of the disclosure and are defined by the scope of the claims, which set forth non-limiting embodiments of the disclosure.

In addition, where features or aspects of the disclosure are described in terms of Markush groups, those skilled in the art will recognize that the disclosure is also thereby described in terms of any individual member or subgroup of members of the Markush group.

What is claimed is:

1. A primer-coated substrate for a microcapsule imaging sheet, the primer-coated substrate comprising a substrate and a primer layer on the substrate, the primer layer comprising:
   a polymeric binder;
   1-14.3 wt. % of polymeric hollow particles, relative to a total weight of the primer layer, wherein the polymeric hollow particles comprise a blend of a first polymeric hollow particle having a first average particle diameter and a second polymeric hollow particle having a second average particle diameter; and
   3-60 wt. % of a white particulate, relative to the total weight of the primer layer.

2. The primer-coated substrate of claim 1, wherein the white particulate is selected from the group consisting of: $TiO_2$, $BaSO_4$, $CaSO_4$, $CaCO_3$, $Al_2O_3$, $Ca_3(PO_4)_2$, and combinations thereof.

3. The primer-coated substrate of claim 1, wherein the white particulate comprises $TiO_2$ and a basic particulate.

4. The primer-coated substrate of claim 1, wherein the white particulate has an average particle size of from about 50 nm to about 2000 nm.

5. The primer-coated substrate of claim 1, wherein a concentration of the white particulate is about 10% to about 50% by weight, relative to the total weight of the primer layer.

6. The primer-coated substrate of claim 1, wherein the polymeric binder comprises a latex polymer having a glass transition temperature of about −70° C. to about 40° C.

7. The primer-coated substrate of claim 1, wherein the polymeric binder is selected from the group consisting of acrylic polymers or copolymers, styrene copolymers, butadiene copolymers, vinyl chloride copolymers, vinylidene chloride copolymers, epoxy copolymers, ethylene copolymers, propylene copolymers, vinyl acetate copolymers, polyesters, polyurethanes, polylactones, polyamides, polyvinyl pyrrolidone, and blends or copolymers thereof.

8. The primer-coated substrate of claim 1, wherein:
   the polymeric hollow particles comprise a polymeric shell and an air core; and
   the polymeric shell comprises a polymer selected from the group consisting of polyacrylates, polymethacrylates, polystyrenes, polyvinyl acetates, polyolefins, polyamides, polyesters, polyureas, polyurethanes, melamine formaldehydes, phenolic resins, and blends or copolymers thereof.

9. The primer-coated substrate of claim 1, wherein the first polymeric hollow particles have an average particle diameter of from about 200 nm to about 2000 nm.

10. The primer-coated substrate of claim 1, wherein the polymeric hollow particles are present at a concentration of about 5% to about 10% by weight, relative to the total weight of the primer layer.

11. A microcapsule imaging sheet, comprising:
   a first substrate;
   a primer layer in contact with a first surface of the first substrate, wherein the primer layer comprises:
      a polymeric binder;
      1-20 wt. % of polymeric hollow particles, relative to a total weight of the primer layer, wherein the polymeric hollow particles comprise a blend of a first polymeric hollow particle having a first average particle diameter and a second polymeric hollow particle having a second average particle diameter; and
      3-60 wt. % of a white particulate, relative to a total weight of the primer layer; and
   a photosensitive microcapsule layer comprising photosensitive microcapsules in contact with the primer layer.

12. The microcapsule imaging sheet of claim 11, wherein the photosensitive microcapsules comprise:
   a polymeric shell; and
   a core comprising a leuco dye, a photoinitiator, and a polymerizable or crosslinkable monomer or oligomer.

13. The microcapsule imaging sheet of claim 11, wherein the white particulate comprises $TiO_2$ and a basic particulate.

14. The microcapsule imaging sheet of claim 11, further comprising a developer layer and a developer substrate, wherein the developer layer is in contact with:
   (i) the microcapsule layer or the primer layer; and
   (ii) the developer substrate.

15. The microcapsule imaging sheet of claim 11, further comprising a back-coat on a second surface of the first substrate.

16. The microcapsule imaging sheet of claim 15, wherein the back-coat comprises a black pigment or dye and a polymeric binder, wherein the black pigment or dye is present at a concentration of 1-30 wt. %, relative to the total weight of the back-coat.

17. The microcapsule imaging sheet of claim 16, wherein the black pigment is carbon black.

18. The microcapsule imaging sheet of claim 16, wherein the back-coat further comprises one or more particulates selected from the group consisting of: $TiO_2$, silica, $BaSO_4$, $CaSO_4$, BN, $CaCO_3$, $Al_2O_3$, AlN, and $Ca_3(PO_4)_2$.

* * * * *